(12) United States Patent
Saito

(10) Patent No.: US 6,479,756 B2
(45) Date of Patent: Nov. 12, 2002

(54) FLEXIBLE WIRING SUBSTRATE AND ITS MANUFACTURING METHOD

(75) Inventor: Hirokazu Saito, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/010,446

(22) Filed: Nov. 8, 2001

(65) Prior Publication Data

US 2002/0048156 A1 Apr. 25, 2002

Related U.S. Application Data

(62) Division of application No. 09/493,936, filed on Jan. 27, 2000, now Pat. No. 6,320,135.

(30) Foreign Application Priority Data

Feb. 3, 1999 (JP) ............................................. 11-025911
Dec. 7, 1999 (JP) ............................................. 11-347524

(51) Int. Cl.[7] .............................. H05K 1/00; H05K 1/03
(52) U.S. Cl. ....................................... 174/250; 174/255
(58) Field of Search ................................. 174/250, 255, 174/256, 259; 29/823, 824, 827, DIG. 99

(56) References Cited

U.S. PATENT DOCUMENTS

| | | | |
|---|---|---|---|
| 4,177,519 A | | 12/1979 | Kasubuchi et al. |
| 4,949,158 A | * | 8/1990 | Ueda ........................ 257/668 |
| 5,338,973 A | | 8/1994 | Yoshigai |
| 5,345,039 A | * | 9/1994 | Yamazaki ................... 174/52.4 |
| 5,585,675 A | | 12/1996 | Knopf |
| 5,820,952 A | | 10/1998 | Kaneko |
| 5,996,768 A | | 12/1999 | Boyce et al. |
| 6,047,832 A | * | 4/2000 | Raschke ..................... 206/714 |
| 6,180,215 B1 | | 1/2001 | Spriesma et al. |
| 6,201,194 B1 | | 3/2001 | Lauffer et al. |
| 6,320,135 B1 | * | 11/2001 | Saito ......................... 174/250 |

FOREIGN PATENT DOCUMENTS

| | | |
|---|---|---|
| JP | 54-121251 | 2/1978 |
| JP | 55-52284 | 4/1980 |
| JP | 55-53477 | 4/1980 |
| JP | 61-107789 | 5/1986 |
| JP | 06-236905 | 8/1994 |
| JP | 08-204309 | 8/1996 |

* cited by examiner

*Primary Examiner*—Brian Sircus
*Assistant Examiner*—Chandrika Prasad
(74) *Attorney, Agent, or Firm*—Frishauf, Holtz, Goodman & Chick, P.C.

(57) ABSTRACT

Predetermined wiring of copper is formed on the upper surface of an elongated base film in a wiring forming area as a width-directional central portion of the base film. Further, band-shaped first reinforcing layers of copper are formed on width-directional opposite portions of the upper surface of the base film. As a result, even if the base film has a relatively thin thickness, portions of the base film near sprocket holes can be made to have a substantially desired strength. To keep the first reinforcing layers out of contact with the pins of a transfer pin roller, opening slightly larger than the sprocket holes are formed in the first reinforcing layers.

34 Claims, 26 Drawing Sheets

FLEXIBLE WIRING SUBSTRATE AND ITS MANUFACTURING METHOD

This application is a Division of application Ser. No. 09/493,936 filed Jan. 27, 2000 now U.S. Pat. No. 6,320,135.

BACKGROUND OF THE INVENTION

This invention relates to a carrier tape, and more particularly to a carrier tape of a COF (Chip On Film) type and its manufacturing method.

Carrier tapes, in which a plurality of flexible wiring substrates are continuously formed along their length, include those of a so-called TAB (Tape Automated Bonding) type and of a so-called COF (Chip On Film) type. The TAB type carrier tape includes a base film having through holes formed in portions near portions on which integrated circuits are formed, and formed in portions near outer leads. The COF type carrier tape includes a base film with no through holes formed in portions near portions on which integrated circuits are formed. These carrier tapes are widely used for the connection of, for example, drivers for use in liquid crystal display devices.

In the TAB type carrier tape, the base film is thick, and is bent at portions on which outer leads are provided, thereby connecting the outer leads to the terminals of an external circuit. To enhance the flexibility of the tape, through holes are formed in those portions of the base film which are located under the outer leads. On the other hand, in the COF type carrier tape, the base film, which is made of polyimide, is relatively thin and highly flexible. Therefore, no through holes are formed in portions of the tape near portions on which integrated circuits are formed.

As is shown in FIG. 35, a carrier tape 21 of the COF type has a plurality of corresponding sprocket holes formed along both left and right side portions of a base film 22, wirings 24 provided on middle surface portions of the base film 22, and protective films 25 each covering corresponding wirings 24 except for opposite terminal portions thereof. The base film 22 is as long as between several tens m to 100 m. After forming the sprocket holes, the base film is subjected to a roll-to-roll treatment using pin rollers.

Since the TAB type base film is generally formed of a polyimide film with a relatively thick thickness of about 75 to 125 $\mu$m, the base film can have a sufficient strength even at portions near the sprocket holes. Accordingly, the pins of the pin roller are reliably engaged with the sprocket holes, thereby enabling smooth transfer of the carrier tape by the pin roller without deforming the sprocket holes.

However, there is a case where a relatively thin film with a thickness of 38 $\mu$m or less is used as the COF type base film 22. In this case, the base film 22 does not have sufficient strength at portions near the sprocket holes 23. Therefore, it is difficult to suitably engage the pins of the pin roller with the sprocket holes 23. Even if the pins may be engaged with the holes, the carrier tape is liable to come away from the pins while it is transferred, and the four corners of each sprocket hole are liable to tear because of mechanical stress that concentrates on the portions of the carrier tape near the sprocket holes while the tape is transferred by the pins. The tears are liable to enlarge, which will cause displacement of the carrier tape 21 and hence will adversely affect the degree of alignment in a later process.

BRIEF SUMMARY OF THE INVENTION

It is an object of the invention to enable smooth transfer, by a pin roller, of a carrier tape having a relatively thin base film, in particular, a COF type carrier tape, without deforming sprocket holes formed in the tape.

It is another object of the invention to provide a manufacturing method for realizing a high productivity of carrier tapes that can reliably be transferred by a pin roller.

To attain the first object, there is provided a carrier tape for connecting an integrated circuit to an external circuit, comprising a reinforcing layer formed on one surface of a base film, and having an opening corresponding to one of holes formed in the base film, the opening having a side facing a direction of a length of the base film and exposing a side portion of the one surface of the base film, the side portion located at the side of the opening. Even if the base film is relatively thin, the reinforcing layer imparts a substantially desirable strength to a portion of the base film near each hole, thereby enabling smooth transfer of the base film by a pin roller without deforming the base film. Further, forming the opening of the reinforcing layer larger than the holes of the base film makes it difficult to bring the pins of the pin roller into contact with the reinforcing layer. As a result, generation of particles when the pins contact the reinforcing layer is minimized, thereby preventing shortcircuiting due to the presence of the particles if the reinforcing layer is formed of a conductive material.

To attain the other object, there is provided a method of manufacturing a carrier tape for connecting an integrated circuit to an external circuit. In this method, reinforcing layers are formed on one surface of a base film such that they have openings corresponding to holes formed in the base film, each of the openings having one-side facing a direction of a length of the base film and exposing one-side portion of the one surface of the base film, the one-side portion located at the one-side of the opening. Accordingly, even if the carrier tape is of the COF type and its base film is relatively thin, the reinforcing layers impart a substantially desirable strength to a portion of the base film near each hole, thereby enabling smooth transfer of the base film by a pin roller without deforming the base film. The openings are formed in the side portions of the reinforcing layer, which are located in the direction of the length of the base film, so as to prevent the pins of the pin roller from contacting the reinforcing layer while the pin roller transfers the base film. This is particularly effective if the reinforcing layer is formed of a conductive material, since particles of the conductive material may cause shortcircuiting of wiring.

Moreover, there is provided another method of manufacturing a carrier tape for connecting an integrated circuit to an external circuit, comprising the steps of: forming wires on one surface of an elongated base film in a central portion of each of carrier-tape-forming areas which are each defined on the one surface and have holes formed in width-directionally opposite portions thereof; and forming reinforcing layers on the one surface of the base film, the reinforcing layers having openings corresponding to the holes of the base film, the openings exposing one-side portions of the one surface of the base film, which are located in a direction of a length or a width of the base film. Accordingly, a plurality of carrier tapes can be manufactured simultaneously, which increases the productivity.

In the step of forming the reinforcing layers in the above method, adjacent reinforcing layers formed in adjacent carrier-tape-forming areas separate from each other by a predetermined distance, so as not to form no reinforcing layer on those portions of the base film at which the base film is cut to be divided into a plurality of carrier tapes. Therefore, no particles will be generated from the reinforcing layers while the base film is cut by, for example, a roll cutter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
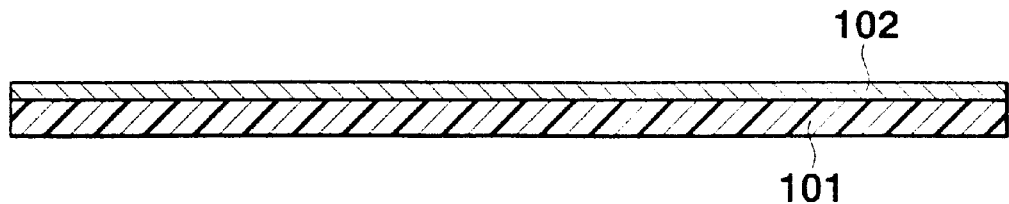
FIG. 1 is a sectional view useful in explaining an initial process of the manufacture of a carrier tape according to a first embodiment of the invention.

Referring to FIGS. 1 to 11, the structure of a carrier tape according to an embodiment of the invention and its manufacturing method will be described. First, as is shown in FIG. 1, a copper film (a first conductive layer) 102 with a total thickness of about 8 $\mu$m is formed on a base film 101 made of polyimide and having a thickness of about 40 $\mu$m or less (for example, about 38 $\mu$m or about 25 $\mu$m) by sputtering and subsequent electrolytic plating. In this case, the base film 101 has a width of about 158 mm and a long length. Although in this embodiment, the carrier tape has a two-layer structure consisting of the base film 101 and the copper layer 102, it may have a three-layer structure formed by adhering a copper foil to the base film 101 with an adhesive layer interposed therebetween.

Figure 2:
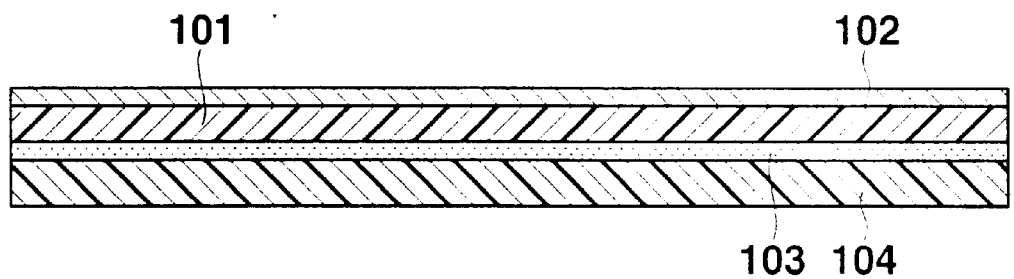
FIG. 2 is a sectional view useful in explaining a process of the manufacture of the carrier tape after the process of FIG. 1.

After that, as is shown in FIG. 2, a reinforcing film 104 with a thickness of about 50 $\mu$m and made of PET (polyethylene terephthalate) is adhered to the lower surface of the base film 101 with an adhesive layer 103 interposed therebetween. The reinforcing film 104 also has a width of about 158 mm and a long length. The reinforcing film 104 is provided for suppressing bending or flex turning of the base film structure due to its own weight corresponding to three to-be-produced carrier tapes (which will be described later) during the transfer of the base film structure in the carrier tape manufacturing process. To this end, the film 104 may have a thickness of 50 μm or more. More specifically, it may have a thickness of about 100 μm or about 125 μm. The thicker the reinforcing film 104, the more reliable the transfer of the base film during the manufacture of a carrier tape.

Figure 3:
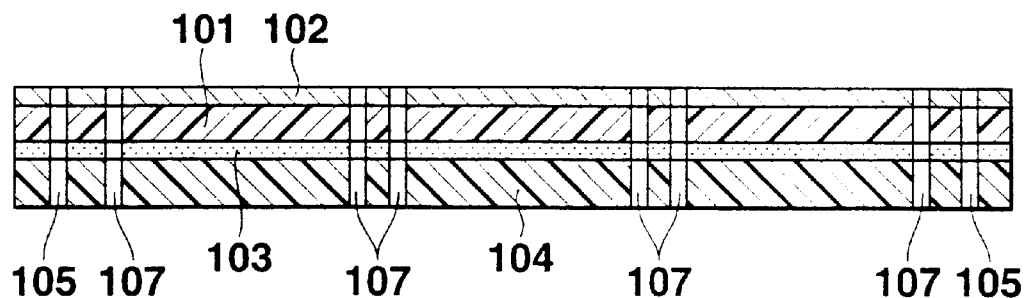
FIG. 3 is a sectional view useful in explaining a process of the manufacture of the carrier tape after the process of FIG. 2.
Figure 4:
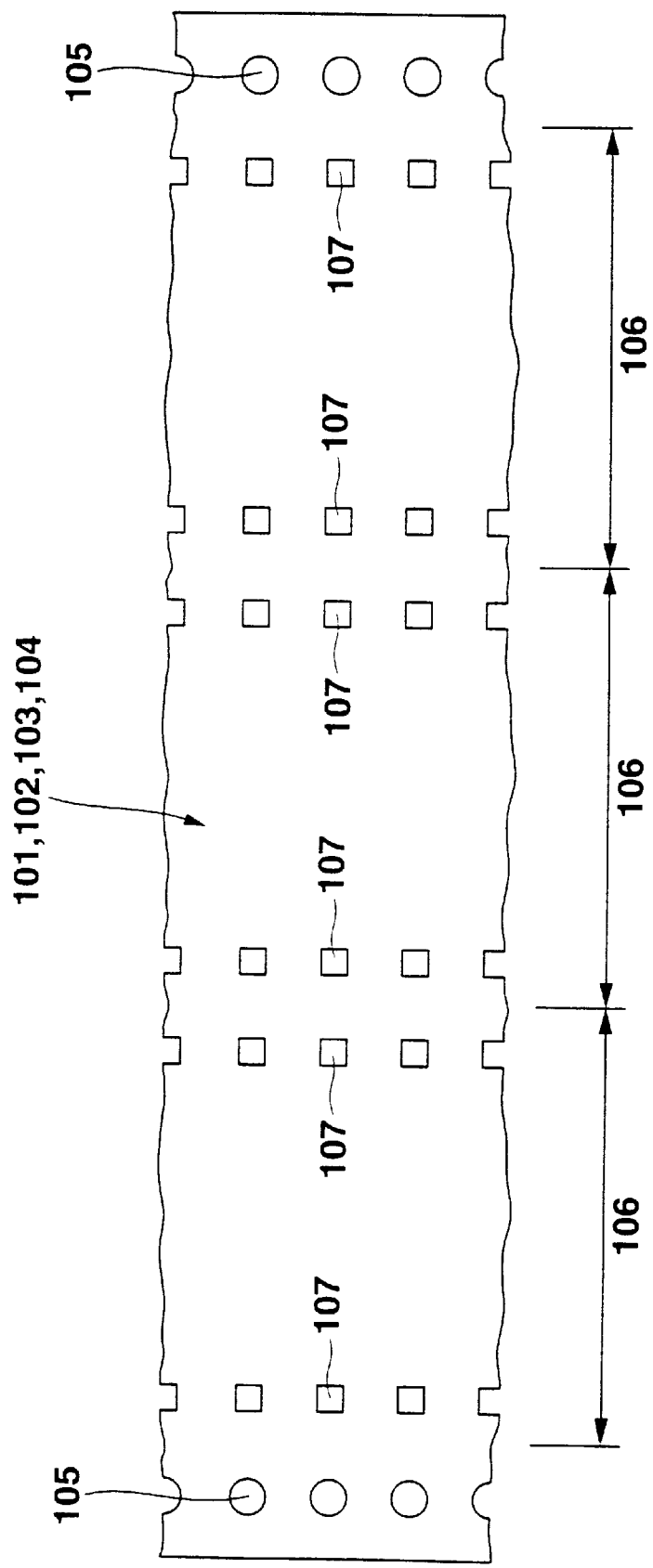
FIG. 4 is a plan view showing part of a state shown in FIG. 3.

Referring then to FIGS. 3 and 4, two rows of first sprocket holes 105 of a circular cross section for forming carrier tapes are respectively formed, by punching using a usual die, in width-directional opposite end portions of the base film 101, the copper layer 102, the adhesive layer 103 and the reinforcing film 104. Further, six rows of second sprocket holes 107 of a square cross section are respectively formed, by similar punching, in width-directional opposite side portions of each of three carrier tape forming areas 106, which are arranged inside the first sprocket holes in a width direction. Each of carrier tape forming areas 106 has a width of about 48 mm. Each row of the first sprocket holes 105 and second sprocket holes are arranged at regular intervals along the length of the base film 101.

Figure 5:
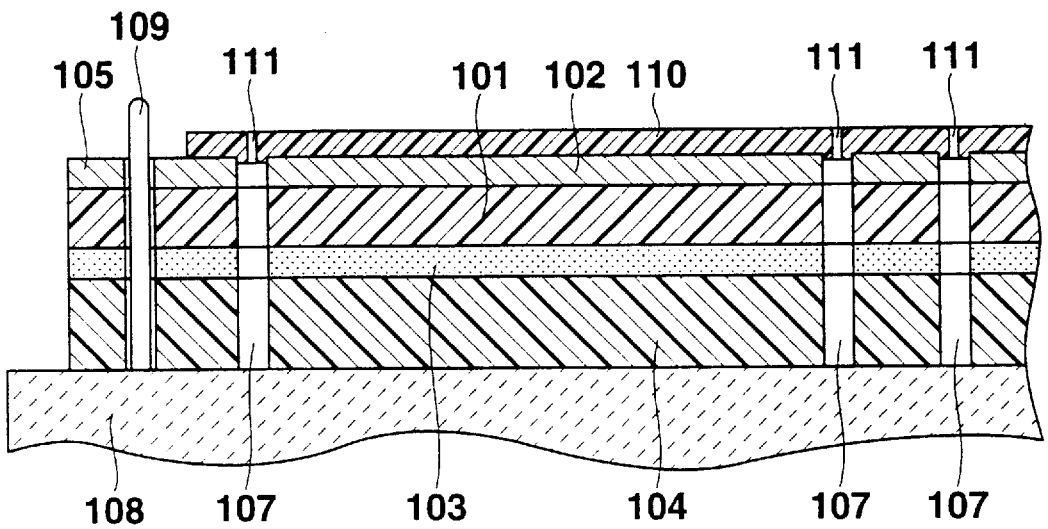
FIG. 5 is a sectional view useful in explaining a process of the manufacture of the carrier tape after the process of FIG. 3.

After that, a pin roller 108 rotates in a predetermined direction in a state in which pins 109 of the pin roller 108 are received in the first sprocket holes 105 formed in the laminated structure, and the reinforcing film 104 is mounted on the pin roller 108, as is shown in FIG. 5, so that a laminated structure of the layers 101–104 is transferred in a predetermined direction. Even if in this case, the base film 101 is relatively thin, the substantial strength of portions of the base film near the sprocket holes 105 can be set at a desired value by virtue of the reinforcing film 104 located at the pin roller 108 side. Accordingly, the transfer of the base film by the pin roller 108 can be executed smoothly, and the sprocket holes 105 can be prevented from deforming.

During the transfer, a resist layer 110 with a thickness of about 4 μm is coated, by, for example, a roller coater, on a width-directional middle portion (with a width of about 145 mm) of the copper layer 102, i.e. on a portion extending between width-directional opposite sprocket holes 105. Since in this case, the square sprocket holes 107 have one side of, for example, about 1.4 mm that is much larger than the thickness (about 4 μm) of the resist layer 110, holes 111 are automatically formed in those portions of the resist layer 110 which correspond to the sprocket holes 107, even when the resist layer 110 is formed by solid coating.

Figure 6:
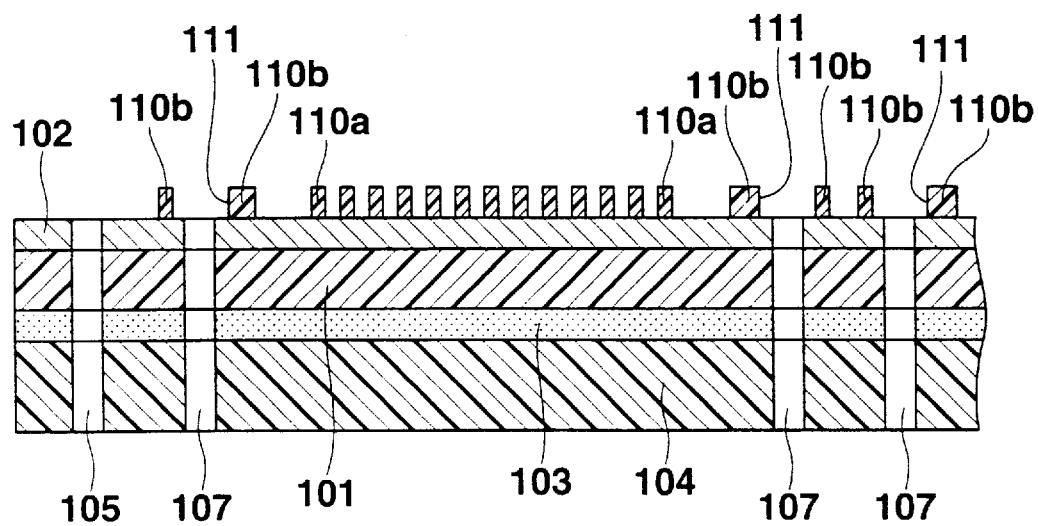
FIG. 6 is a sectional view useful in explaining a process of the manufacture of the carrier tape after the process of FIG. 5.
Figure 7:
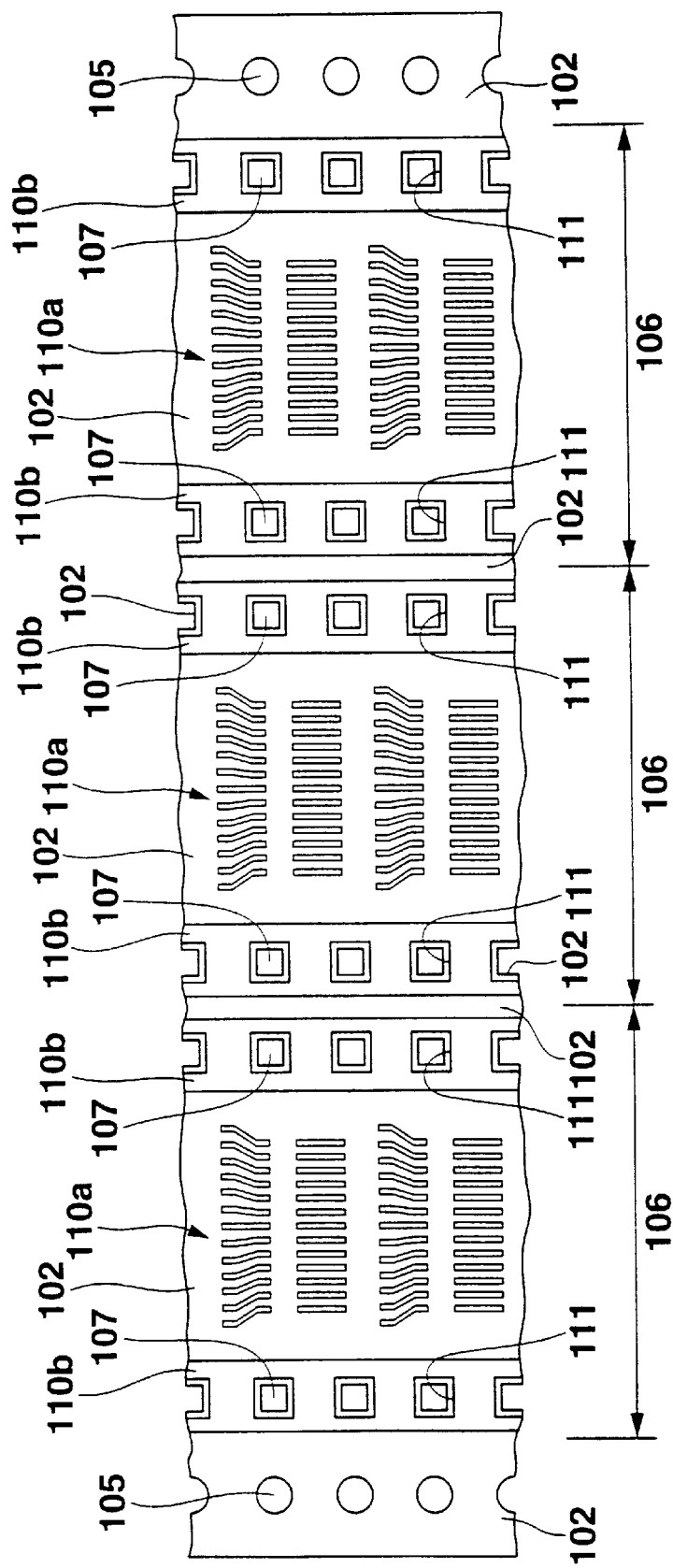
FIG. 7 is a plan view showing part of a state shown in FIG. 6.

Subsequently, as is shown in FIGS. 6 and 7, a predetermined resist pattern 110a is formed, by predetermined exposure and development treatments of the resist lager 110, on the copper layer 102 in a wiring-to-be-formed area that is width-directional middle one of the three carrier-tape-forming areas 106. Further, six band-shaped resist patterns 110b are formed from the resist lager 110 on the copper layer 102, which each have square openings 111 (each opening is formed such that it surrounds a corresponding one of the sprocket holes 107 with a predetermined distance therebetween) and extend along the length of the base film 101. In other words, the square opening 111 slightly larger than the second sprocket hole 107 is formed on that portion of the resist pattern 110b, which corresponds to each sprocket hole 107. Moreover, in each carrier tape forming area 106, each sprocket hole 107 is provided closer to the width-directionally outside edge of a corresponding resist pattern 110b than to the width-directionally inside edge closed to the pattern 110a. The six resist patterns 110b are provided on the base film 101, width-directionally separated from each other.

Figure 8:
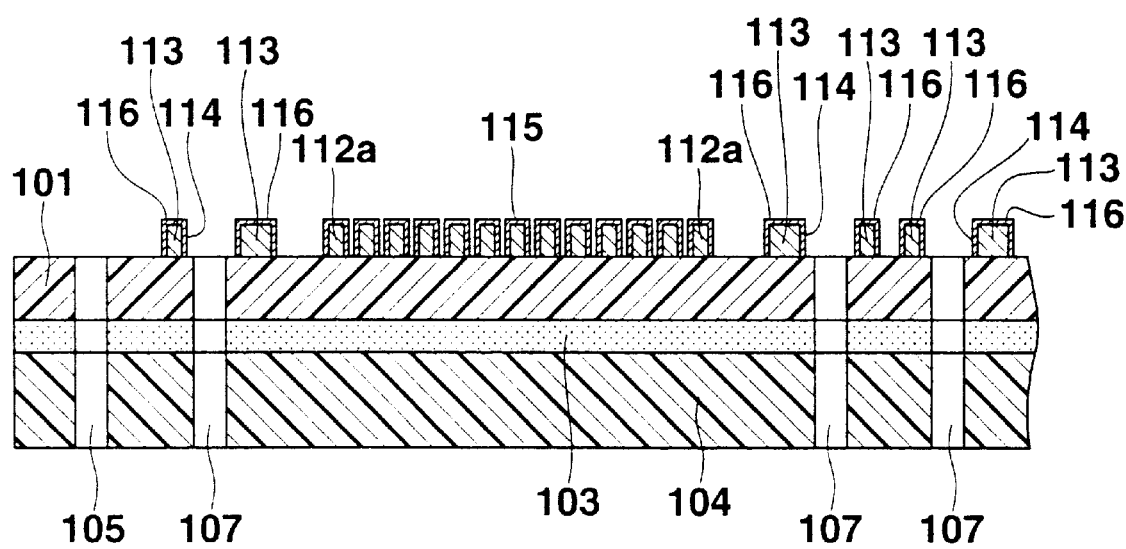
FIG. 8 is a sectional view useful in explaining a process of the manufacture of the carrier tape after the process of FIG. 6.
Figure 9:
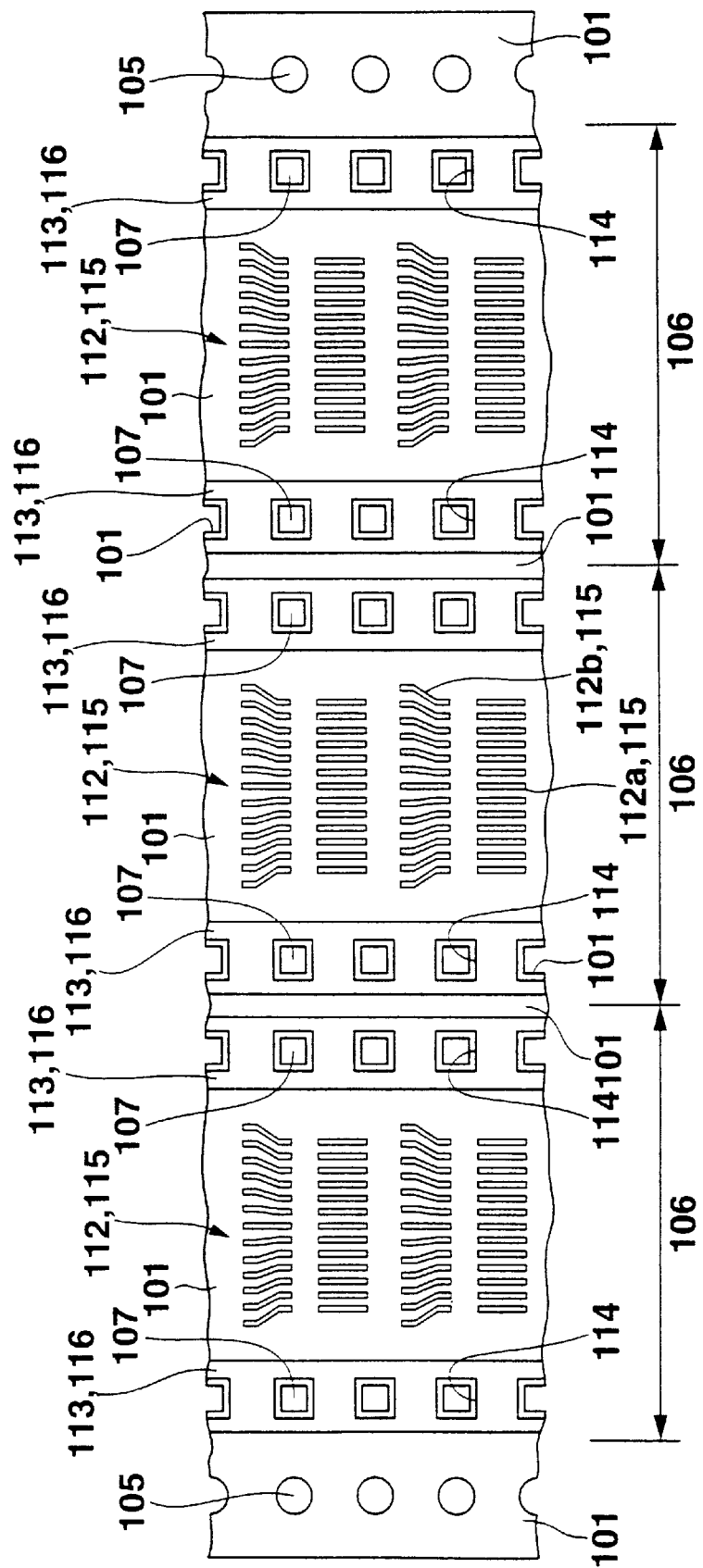
FIG. 9 is a plan view showing part of a state shown in FIG. 8.

After that, the copper layer 102 is subjected to wet etching, using the resist patterns 110a and 110b as masks, and then the resist patterns 110a and 110b are eliminated to obtain a structure as shown in FIGS. 8 and 9. Specifically, predetermined wiring 112 is formed on the base film 101 in the wiring forming area as the width-directional middle area of each carrier tape forming area 106. At the same time, six band-shaped first reinforcing layers 113 made of copper are formed on the base film 101, which each have openings (each opening is formed such that it surrounds a corresponding one of the second sprocket holes 107 with a predetermined distance therebetween) and extend along the length of the base film 101. The six first reinforcing layers 113 are provided on the base film 101, width-directionally separated from each other. The wiring 112 of each flexible wiring substrate includes a plurality of input wires 112a and a plurality of output wires 112b. No first reinforcing layers 113 are provided on those portions of the base film 101 which are located around the first sprocket holes 105.

Subsequently, non-eletrolytic plating of tin is executed to form tin plate layers 115 and 116 (second conductive layers) on the wiring 112 and the first reinforcing layers 113, respectively. The resultant six band-shaped tin plate layers 116 are provided on the base film 101, width-directionally separated from each other. The first reinforcing layers 113 and the tin plate layers 116 have openings (walls) 114 each formed such that it surrounds a corresponding one of the second sprocket holes 107 with a predetermined distance therebetween.

Figure 10:
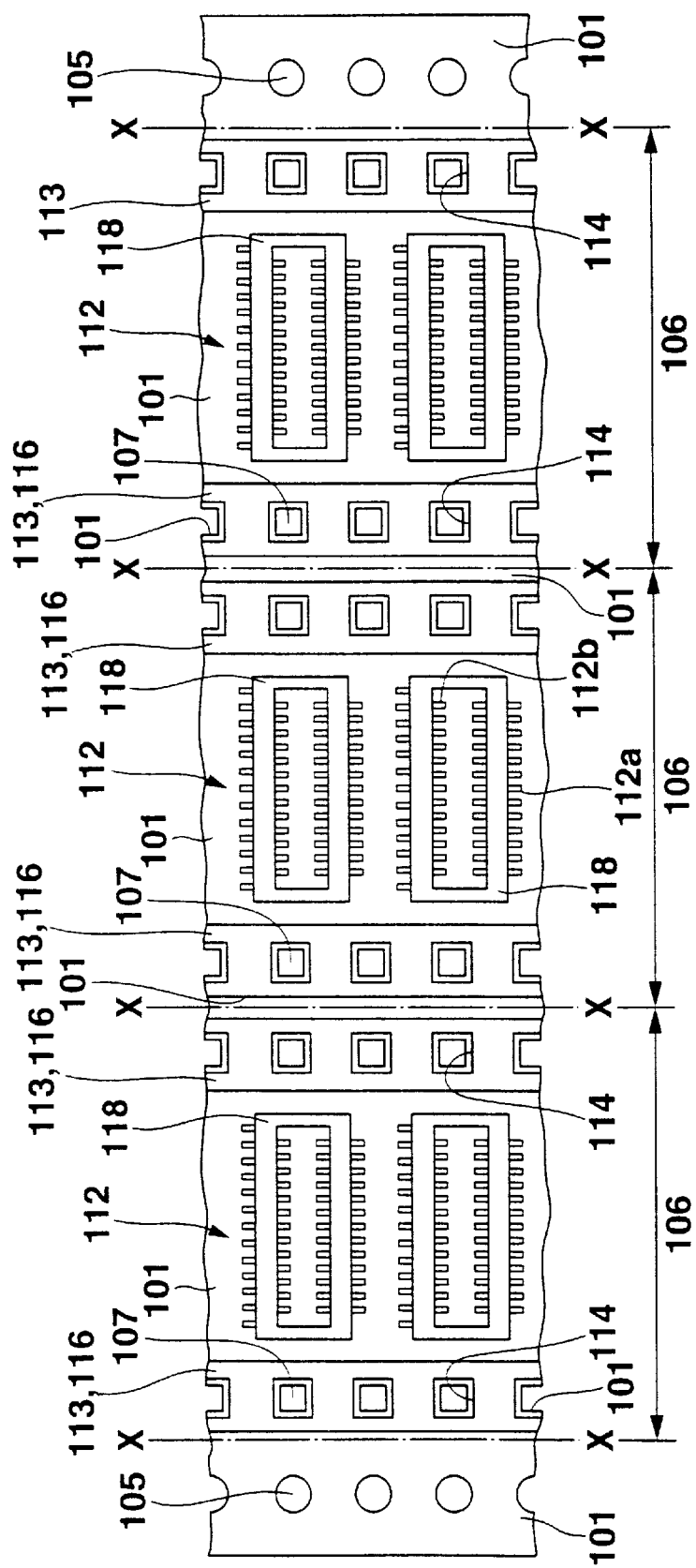
FIG. 10 is a partial plan view useful in explaining a process of the manufacture of the carrier tape after the process of FIG. 9.
Figure 11:
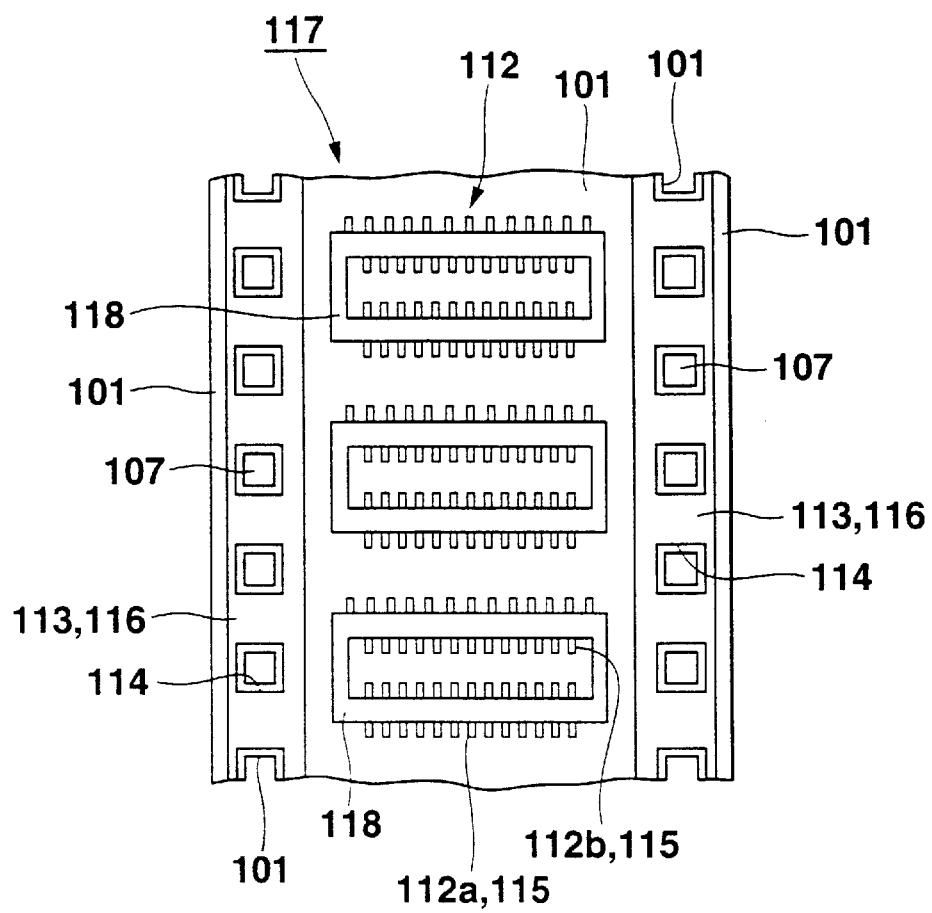
FIG. 11 is a plan view showing part of a carrier tape of the invention.

After that, as shown in FIG. 10, protective films 118 made of a solder resist in the form of a rectangular frame are provided, by, for example, screen printing, on a central portion of each input wire 112a, a central portion of each output wire 112b and predetermined portions near the central portions. Then, the base film 101, the adhesive layer 103 and the reinforcing film 104 are cut along each one-dot-chain line X—X in FIG. 10, along which no first reinforcing layers 113 and tin plate layers 115 and 116 are provided, thereby forming three carrier tapes each having the reinforcing film 104 attached thereto. In the final stage, the reinforcing film 104 is detached from the base film 101 together with the adhesive layer 103, thereby providing three long carrier tapes 117, each of which has a width of about 48 mm as shown in FIG. 11. Since the to-be-cut portions indicated by the one-dot-chain lines in FIG. 10 include neither first reinforcing layers 113 nor second reinforcing layers 116 formed thereon by tin plating, metal particles, which will occur when a portion including the first reinforcing layer 113 is cut, can be prevented from occurrence. This leads to prevention of shortcircuiting of the wiring 112 due to occurrence of metal particles.

Figure 12:
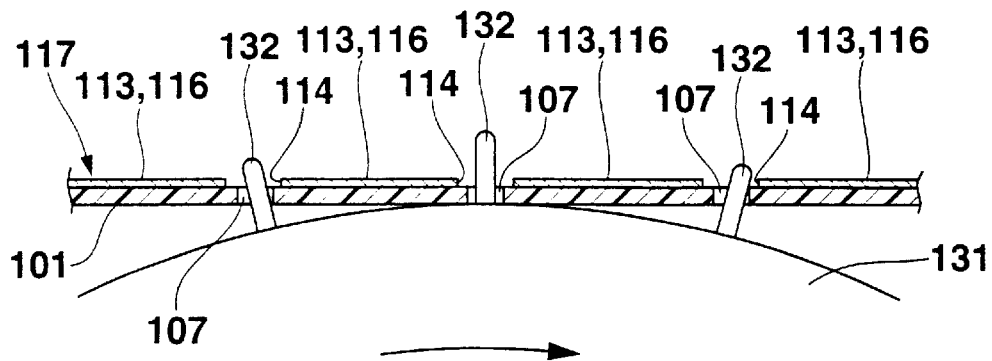
FIG. 12 is a sectional view showing part of a state in which the carrier tape of FIG. 11 is transferred by a pin roller.

The resultant carrier tape 117 has a sufficient strength even at portions near the second sprocket holes 107, even if the base film 101 has a relatively thin thickness of about 38 μm or less (for example, about 38 μm or about 25 μm). This is because the band-shaped first reinforcing layer 113 and tin plate layer (second reinforcing layer) 116 are formed on width-directional opposite side portions of the base film 101, i.e. because the first and second reinforcing layers 113 and 116 are formed on those portions of the base film 101 which surround the second sprocket holes 107. Accordingly, in a process for connecting an integrated circuit to the carrier tape 117 by inserting pins 132 of a pin roller 131 into sprocket holes 107, even when the integrated circuit is held on the carrier tape 117, the base film 101 can be prevented from being bent, because of the weight of the integrated circuit, to a degree at which the pins come away from the sprocket holes 107. Further, the carrier tape, 117 can be transferred smoothly by the pin roller 131 in a predetermined direction by engaging the pins 132 of the pin roller 131 with sprocket holes 107 of the carrier tape 117, and rotating the pin roller 131 in a direction indicated by the arrow, as is shown in FIG. 12. Even when in this case, mechanical stress is concentrated on each sprocket hole 107 as a result of the rotation of the pin roller 131, each sprocket hole 107 is prevented from deforming. This will not adversely affect the alignment accuracy in a later process, which will be described later. These advantages can be obtained only by the first reinforcing layers 113.

In the carrier tape 117, rectangular openings 114 slightly larger than the sprocket holes 107 are formed in those portions of the first and second reinforcing layers 113 and 116 which correspond to the sprocket holes 107. The reason why this structure is employed will be described. When transferring the carrier tape 117 with some pins 132 of the pin roller 131 engaged with some of the sprocket holes 107, the pins 132 are prevented from contacting the first reinforcing layer 113 or the tine plate layer 116 provided thereon, as is shown in FIG. 12. As a result, metal particles, which will occur when the pins 132 contact the first reinforcing layer 113 or the tine plate layer 116 provided thereon, can be prevented from occurrence. Further, even if a crack occurs in the base film 101 from each rear corner of each sprocket hole 107 with respect to a direction of transfer, its expansion can be limited within a corresponding opening 114.

Figure 13:
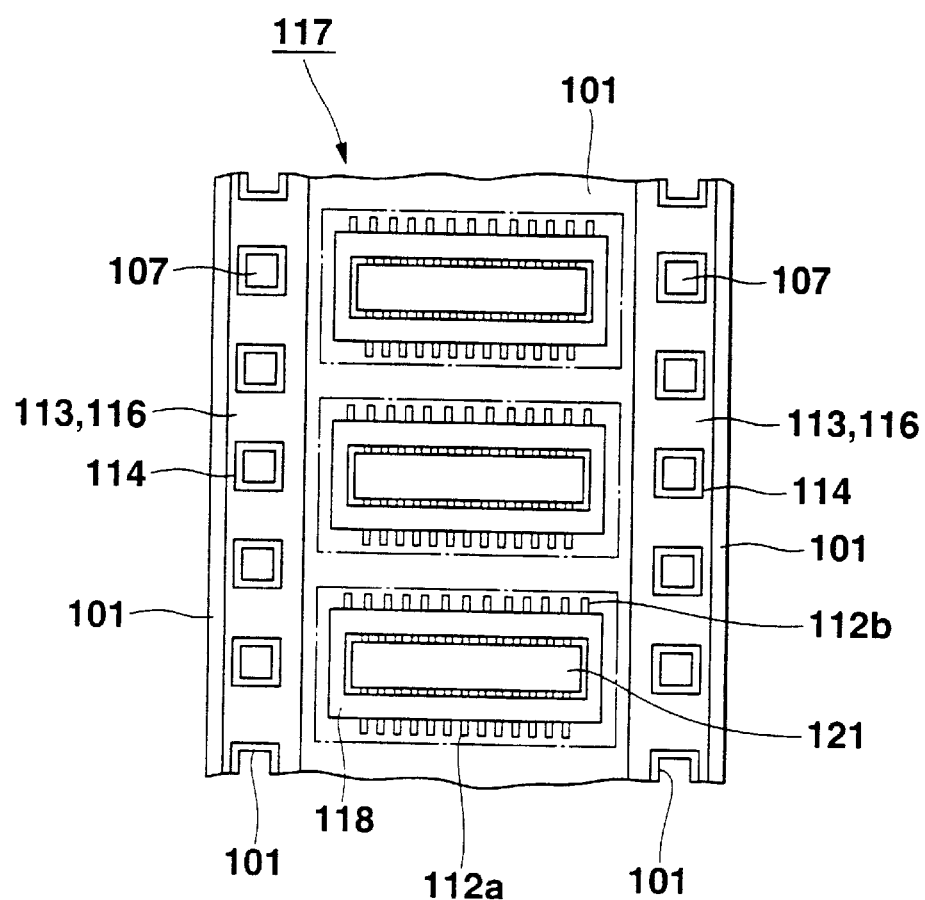
FIG. 13 is a plan view showing part of a state in which semiconductor chips are mounted on the carrier tape of FIG. 11.
Figure 14:
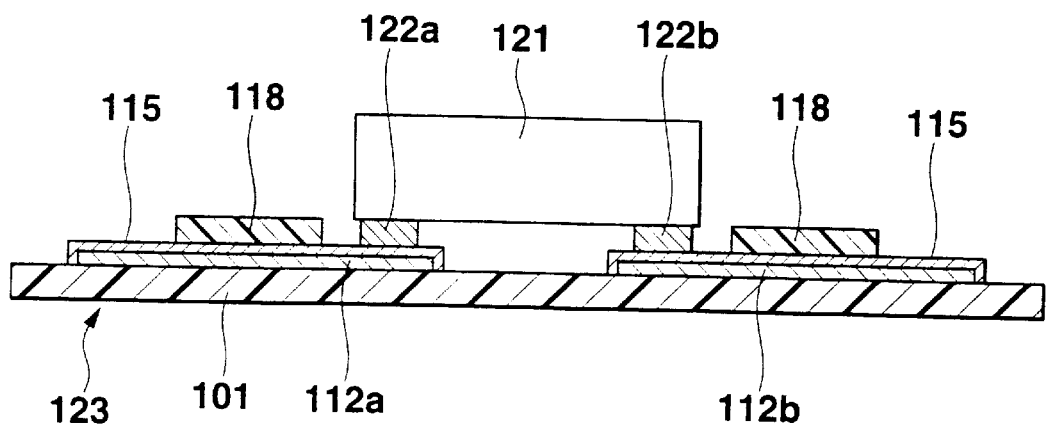
FIG. 14 is a sectional view showing a COF obtained by the manufacturing process of FIG. 13.

FIG. 13 is a plan view partially showing a state in which semiconductor chips 121 consisting of LSIs for driving a liquid crystal panel are mounted on the carrier tape 117 shown in FIG. 12. While the carrier tape 117 is intermittently transferred by the pin roller 131, input-side and output-side metal bumps 122a and 122b provided on width-directionally opposite side portions of the lower surface of each semiconductor chip 121 are respectively thermocompression bonded onto those portions of the tin plate layer 115 which correspond to corresponding one ends of the input and output wiring 112a and 112b, as is shown in FIG. 14. After that, the base film 101 is cut along the one-dot-chain lines of FIG. 10 by punching using a usual die, thereby obtaining a COF 123 as shown in FIG. 14.

Figure 15:
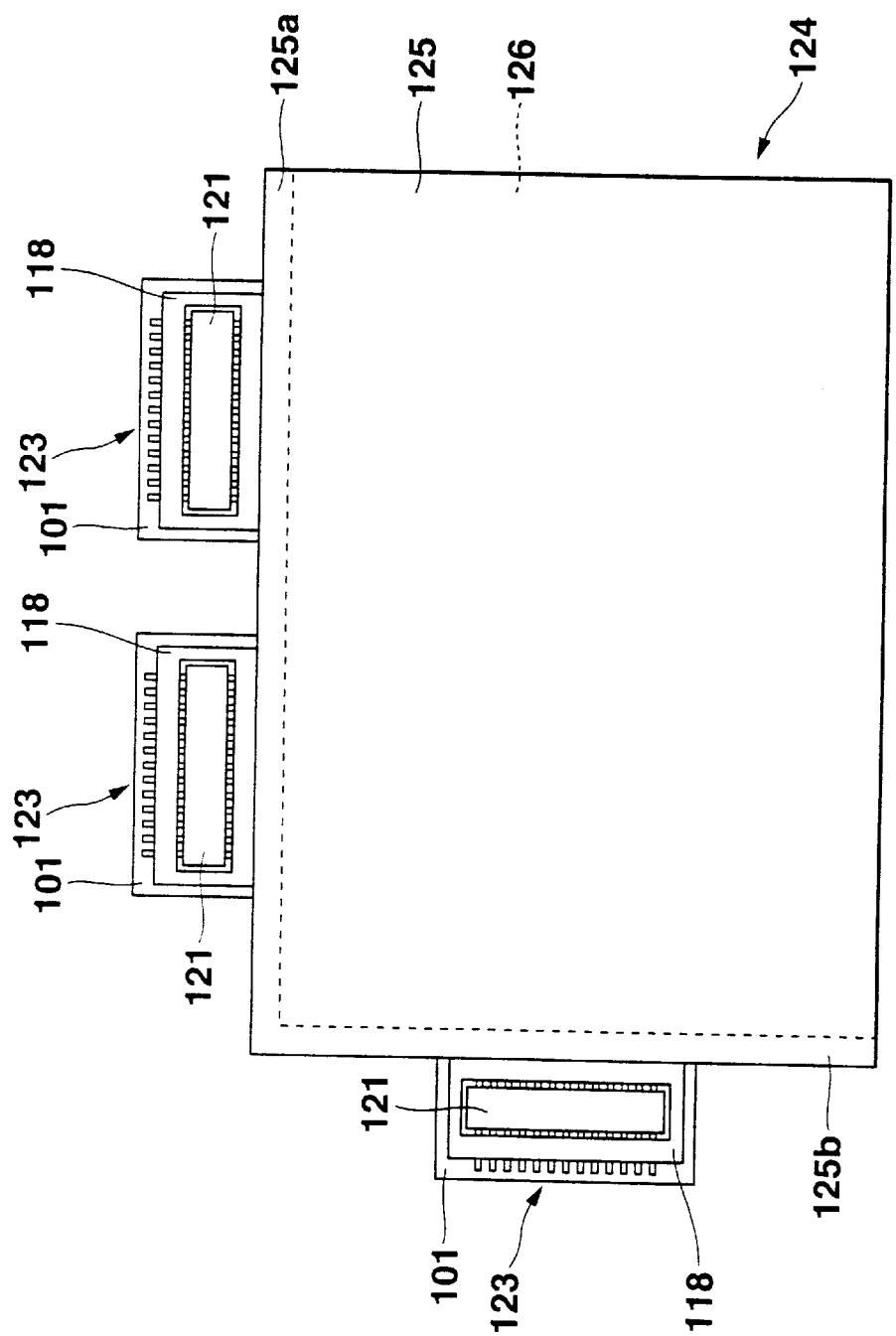
FIG. 15 is a plan view illustrating a state in which COFs as shown in FIG. 4 are connected to a liquid crystal display panel.
Figure 16:
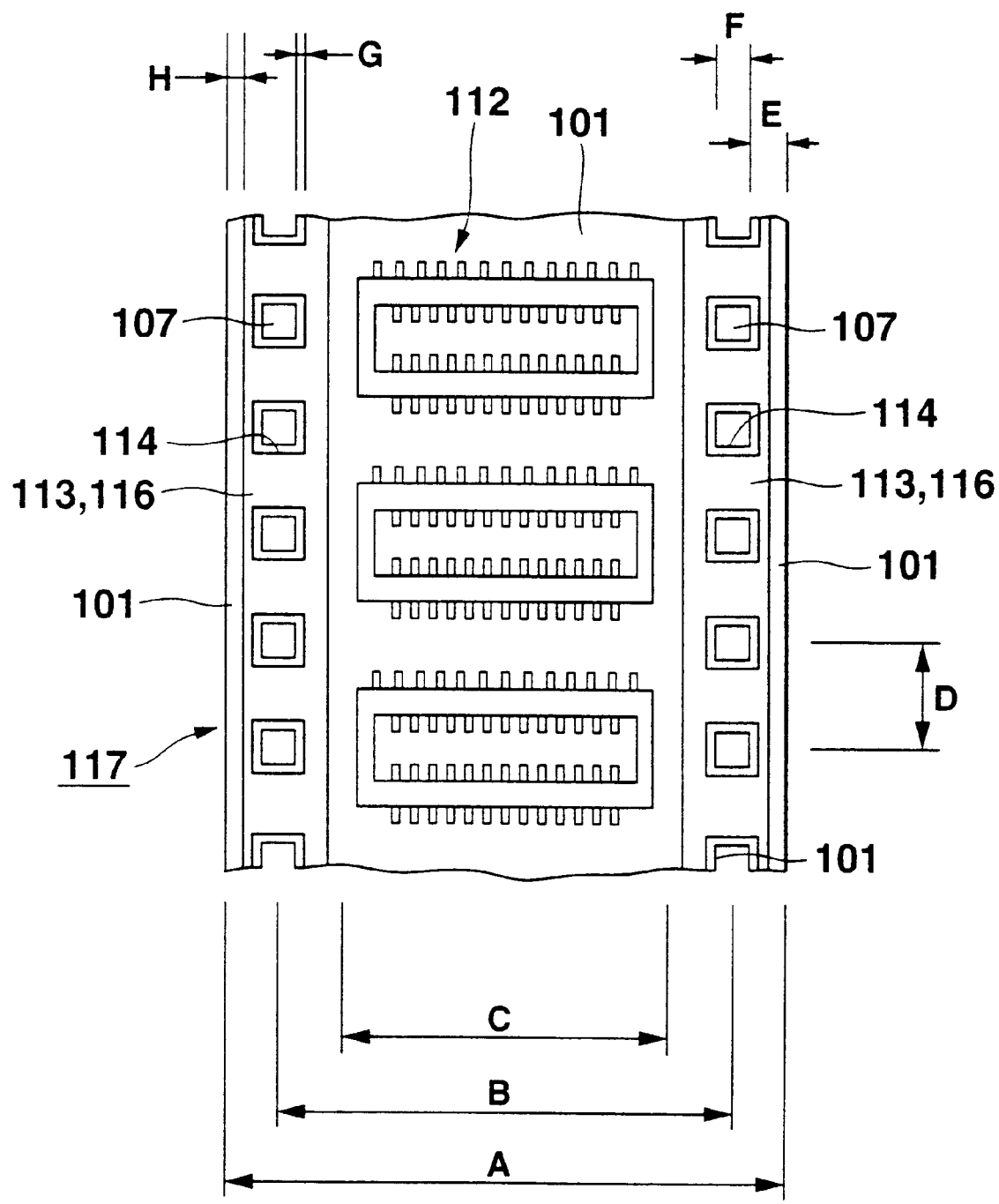
FIG. 16 is a plan view useful in explaining a dimension, as an example, of each section of various types of carrier tapes.

FIG. 15 is a plan view illustrating a state in which the COFs 123 shown in FIG. 14 are attached to a liquid crystal display panel 124. The liquid crystal panel 124 includes two glass substrates 125 and 126 coupled to each other with liquid crystal (not shown) sealed therebetween. Predetermined two sides 125a and 125b of the glass substrate 125 project from the other glass substrate 126. Those portions of the tin plate layer 115 which are located on the other end of the output wiring 126b of the COF 123 are adhered to respective predetermined two portions of the lower surface of the projection 125a by an aeolotropic conductive adhesive (not shown). Moreover, that portion of the tin plate layer 115 which is located on the other end of the output wiring 126b of the COF 123 is adhered to a predetermined portion of the lower surface of the projection 125b by the aeolotropic conductive adhesive.

Although in the embodiment, three carrier tapes with a width of 48 mm are created from the base film with a width of 158 mm, the width of the base film and the number of carrier tapes are not limited to the above. For example, four carrier tapes with a width of 35 mm may be formed, or two carrier tapes with a width of 70 mm may be created.

An example of a dimension of each section of the aforementioned three carrier tapes will be described. More specifically, data will be given of two examples of each of the carrier tapes with the widths of 35 mm and 48 mm, and to one example of the carrier tape with the width of 70 mm. Further, concerning each carrier tape, A indicates the film width, B the distance between the center points of each pair of width-directionally arranged ones of the sprocket holes 107, C the width of an effective area, D the pitch with which the sprocket holes are arranged along the length of the tape, E the distance between each sprocket hole 107 and a film edge closer thereto, F the length of one side of each square sprocket hole 107, G the distance between each sprocket hole 107 and a corresponding opening 114, and H the distance between the first and second reinforcing layers 113 and 116 and a film edge.

Figure 17:
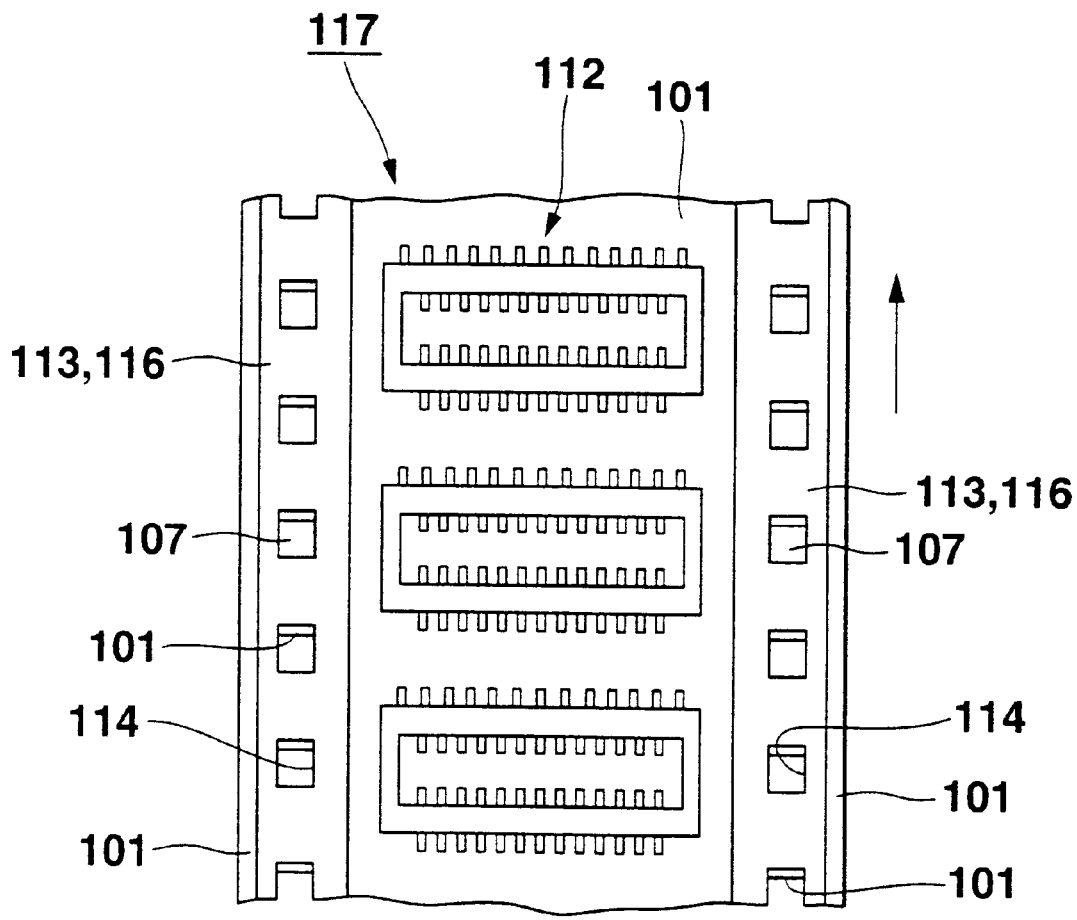
FIG. 17 is a plan view useful in explaining part of a carrier tape as a first example.

A first carrier tape with the width of 35 mm has the following dimensions:
A=34.975±0.2 mm
B=28.977±0.05 mm
C=26 mm
D=4.75±0.04 mm
E=2.01±0.2 mm
F=1.981±0.04 mm
G=0.2 mm
H=0.3 mm A second carrier tape with the width of 35 mm has the following dimensions:
A=34.975±0.2 mm
B=31.82±0.05 mm
C=29 mm
D=4.75±0.04 mm
E=0.8675±0.2 mm
F=1.42±0.04 mm
G=0.2 mm
H=0.3 mm A first carrier tape with the width of 48 mm has the following dimensions:
A=48.175±0.2 mm
B=42.177±0.07 mm
C=41.6 mm
D=4.75±0.04 mm
E=2.0085±0.2 mm
F=1.981±0.04 mm
G=0.2 mm
H=0.3 mm A second carrier tape with the width of 48 mm has the following dimensions:
A=48.175±0.2 mm
B=44.86±0.07 mm
C=41.6 mm
D=4.75±0.04 mm
E=0.9475±0.2 mm
F=1.42±0.04 mm
G=0.2 mm
H=0.3 mm A carrier tape with the width of 70 mm has the following dimensions:
A=69.95±0.2 mm
B=63.949±0.08 mm
C=61 mm
D=4.75±0.04 mm E=2.01±0.2 mm
F=1.981±0.04 mm
G=0.2 mm
H=0.3 mm In the above-described embodiments, a square opening 114 slightly larger than the sprocket hole 107 is formed in that portion of the first and second reinforcing layers 113 and 116 which corresponds to the sprocket hole 107, as is shown in FIG. 11. However, the opening 114 is not limited to this, but may be modified as shown in FIG. 17. In FIG. 17, the first and second reinforcing layers 113 and 116 are provided on width-directional opposite side portions, except for edge portions, of the base film 101, and the openings 114 are formed in those portions of the layers 113 and 116 which correspond to the sprocket holes 107 and extend from the holes 107 to downstream portions of the base film 101 with respect to the direction of transfer indicated by the arrow in FIG. 17.

Figure 18:
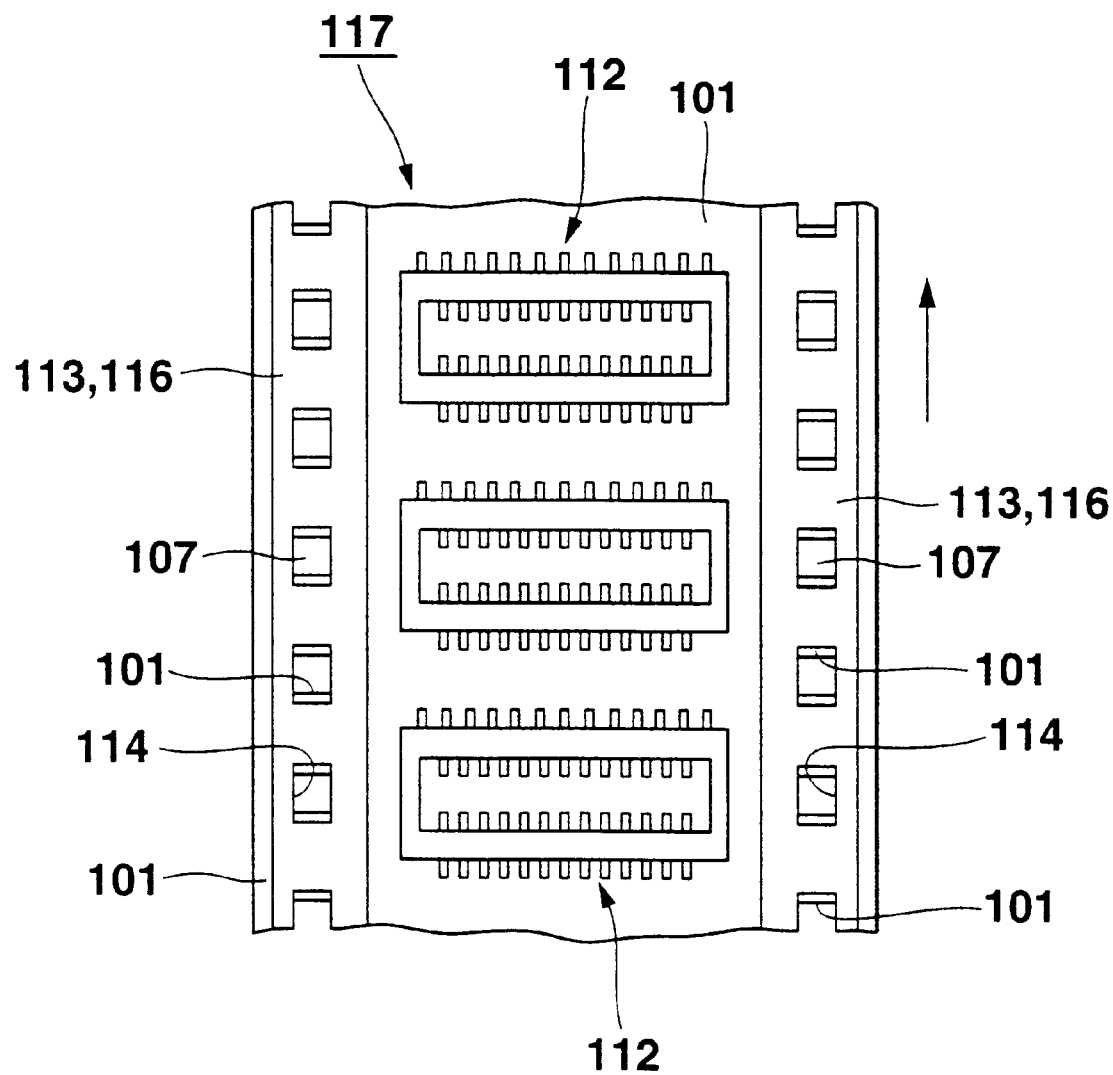
FIG. 18 is a plan view useful in explaining part of a carrier tape as a second example.

Further, the openings 114 may be modified as shown in FIG. 18. In FIG. 18, the first and second reinforcing layers 113 and 116 are provided on width-directional opposite side portions, except for edge portions, of the base film 101, and the openings 114 are formed in those portions of the layers 113 and 116 which correspond to the sprocket holes 107 and extend from the holes 107 to upstream and downstream portions of the base film 101 with respect to the direction of transfer indicated by the arrow in FIG. 18.

Figure 19:
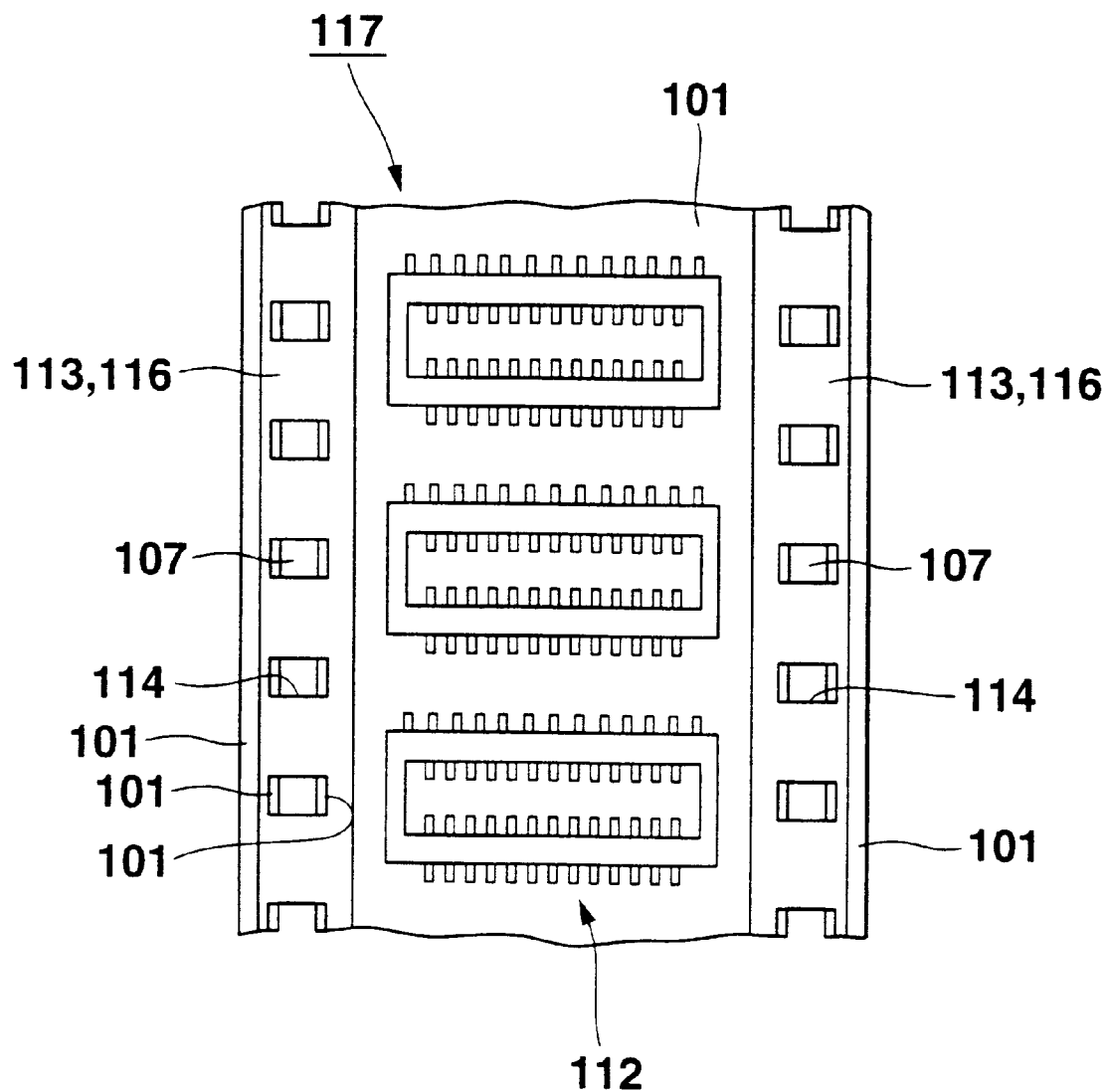
FIG. 19 is a plan view useful in explaining part of a carrier tape as a third example.

The openings 114 may also be modified as shown in FIG. 19. In FIG. 19, the first and second reinforcing layers 113 and 116 are provided on width-directional opposite side portions, except for edge portions, of the base film 101, and the openings 114 are formed in those portions of the layers 113 and 116 which correspond to the sprocket holes 107 and extend from the holes 107 to width-directional opposite side portions of the base film 101. By virtue of this structure, the pins of the pin roller 131 can be prevented from contacting the first or second reinforcing layer 113 or 116.

The openings 114 may be formed such that the sprocket holes 107 and width-directional one-side portions of the base film 101 are exposed through the openings.

Figure 20:
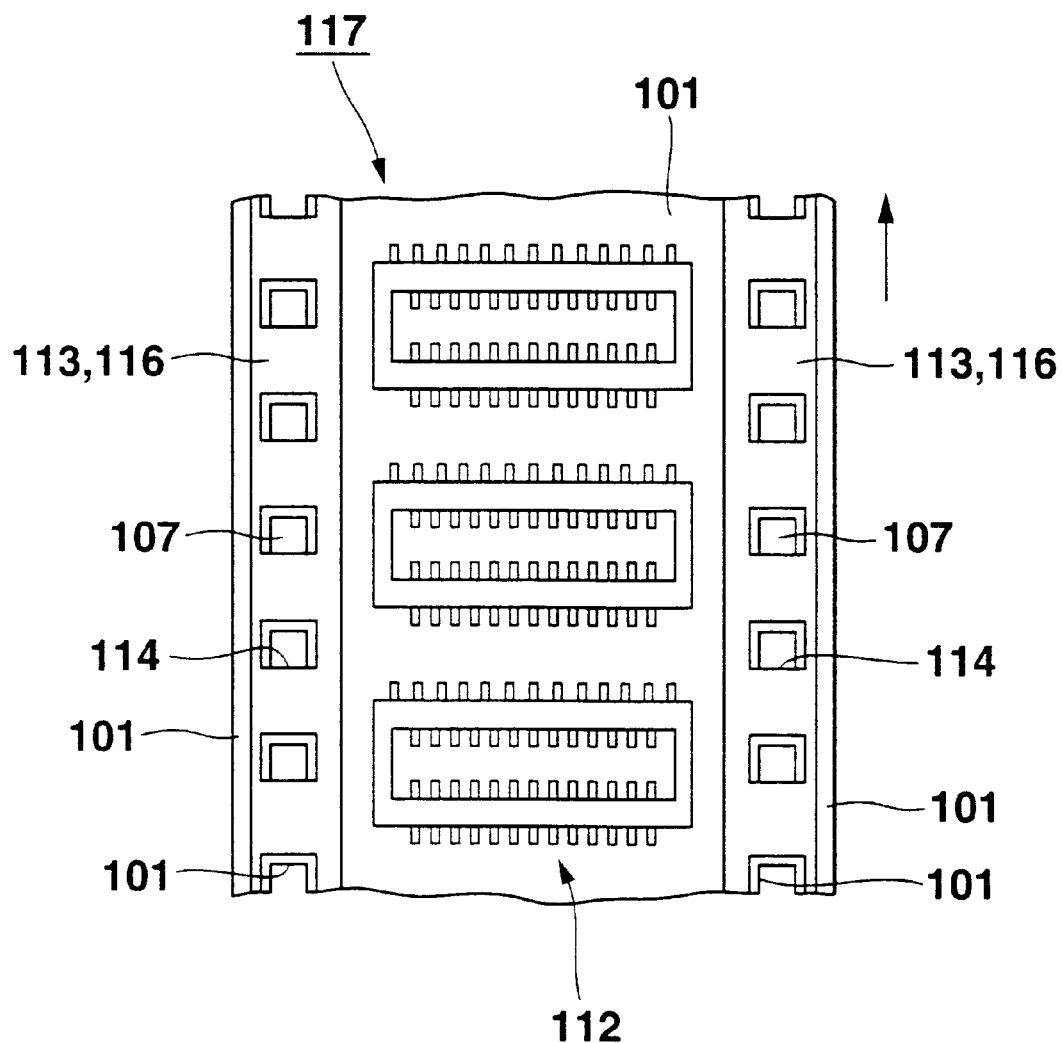
FIG. 20 is a plan view useful in explaining part of a carrier tape as a fourth example.

In addition, the openings 114 may be modified as shown in FIG. 20. In FIG. 20, the first and second reinforcing layers 113 and 116 are provided on width-directional opposite side portions, except for edge portions, of the base film 101, and the openings 114 are formed in those portions of the layers 113 and 116, which correspond to the sprocket holes 107, extend from the holes 107 to downstream portions of the base film 101 with respect to the transfer direction indicated by the arrow in FIG. 20, and also extend from the holes 107 to width-directional opposite side portions of the base film 101.

Figure 21:
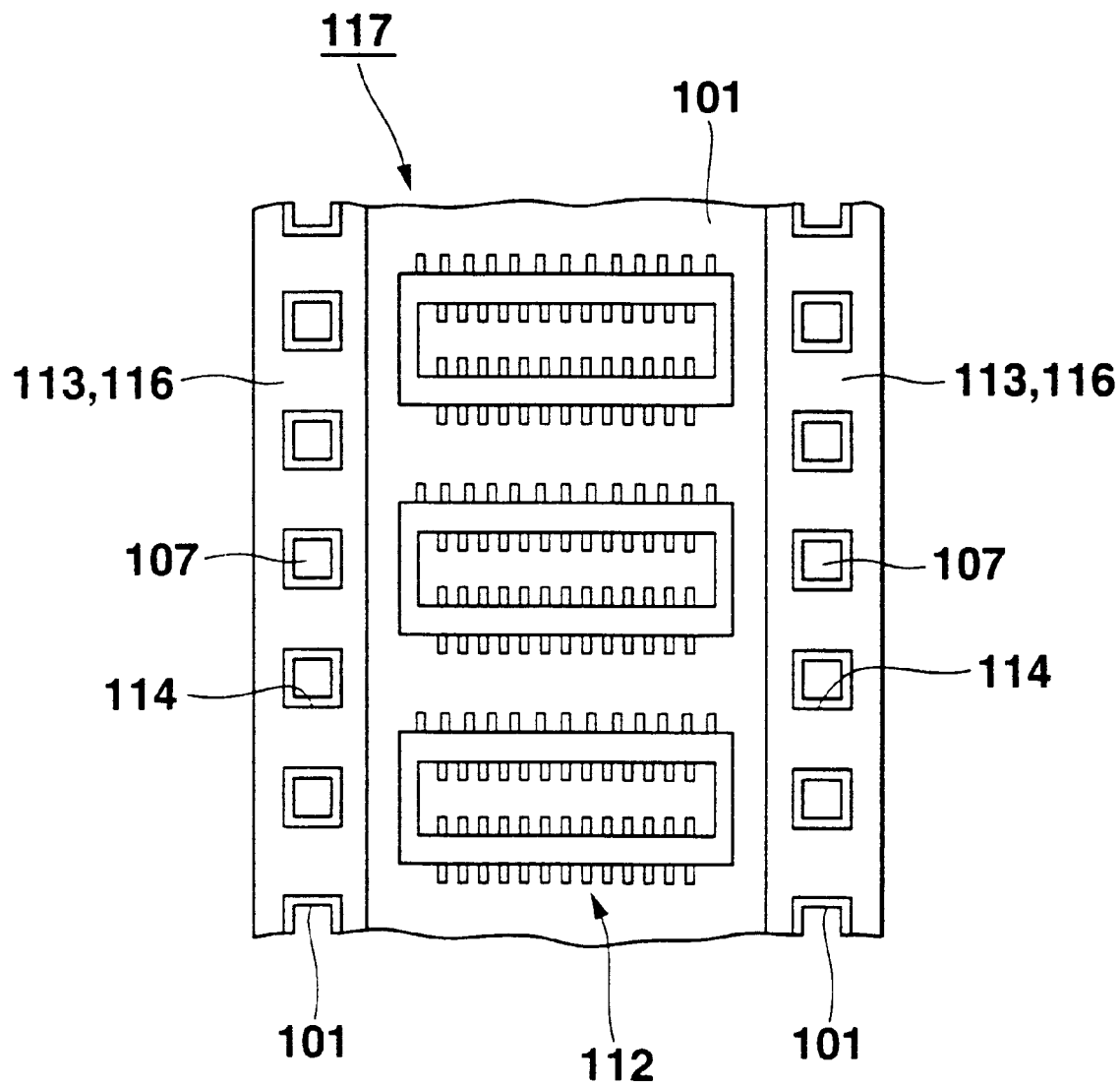
FIG. 21 is a plan view useful in explaining part of a carrier tape as a fifth example.

Although in the above embodiments, the first and second reinforcing layers 113 and 116 are provided on width-directional opposite side portions, except for edge portions, of the base film 101, as is shown in FIGS. 11 to 20, they are not limited to this structure. Alternatively, the first and second reinforcing layers 113 and 116 may be provided on width-directional opposite side portions, including edge portions, of the base film 101, as is shown in FIG. 21. This structure can also be applied to the cases of FIGS. 17 to 20.

Figure 22:
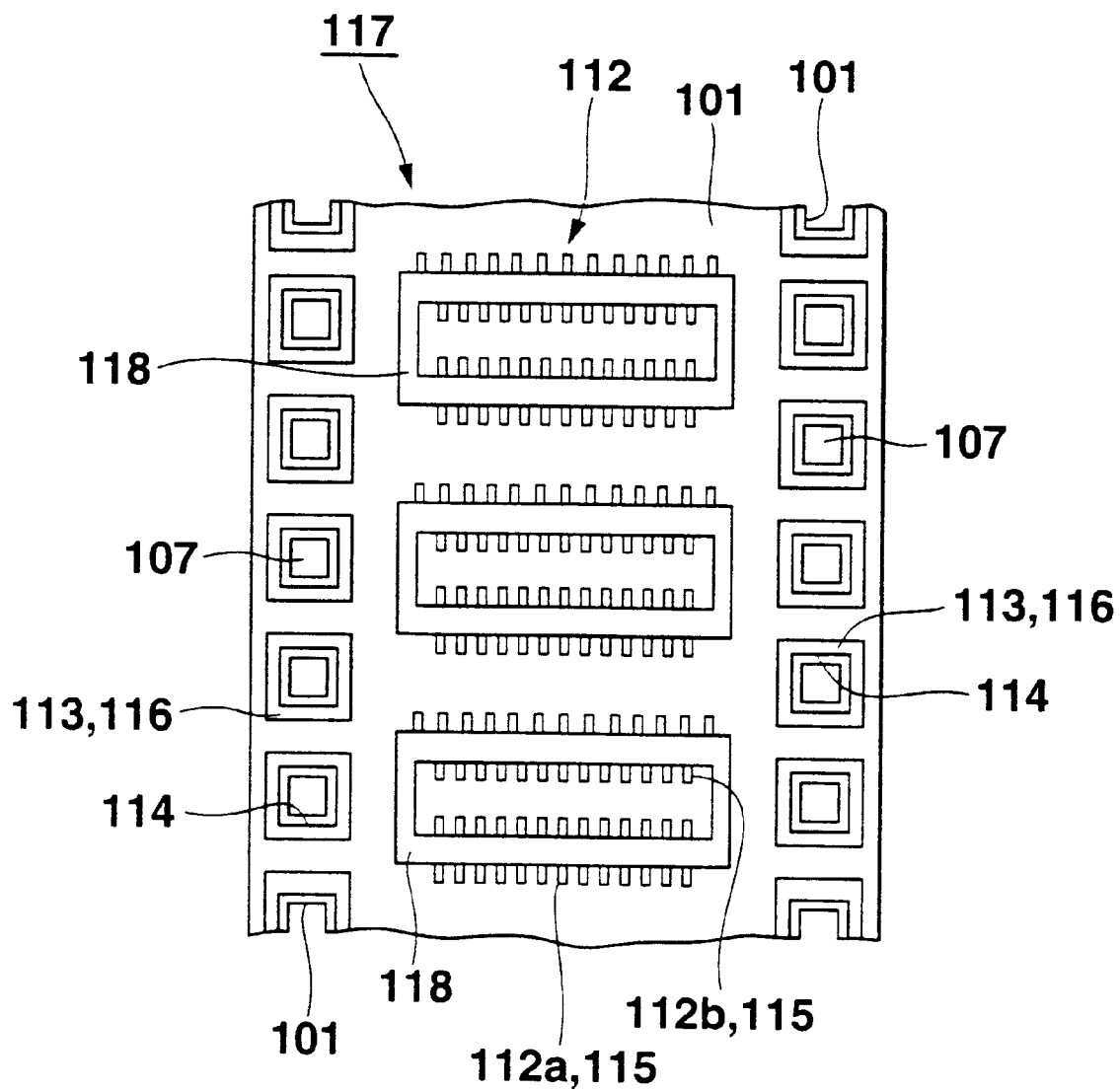
FIG. 22 is a plan view useful in explaining part of a carrier tape as a sixth example.
Figure 23:
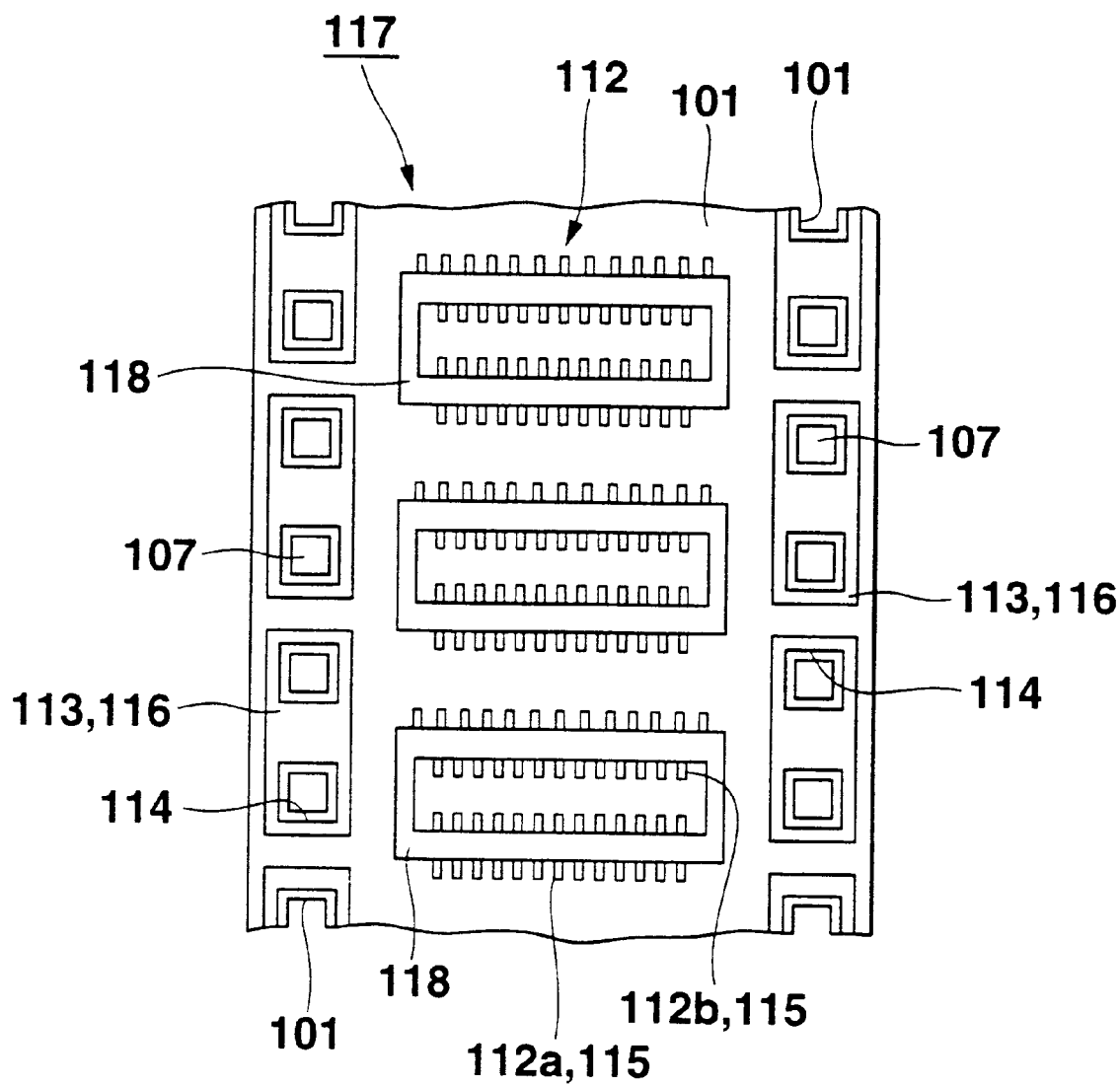
FIG. 23 is a plan view useful in explaining part of a carrier tape as a seventh example.
Figure 24:
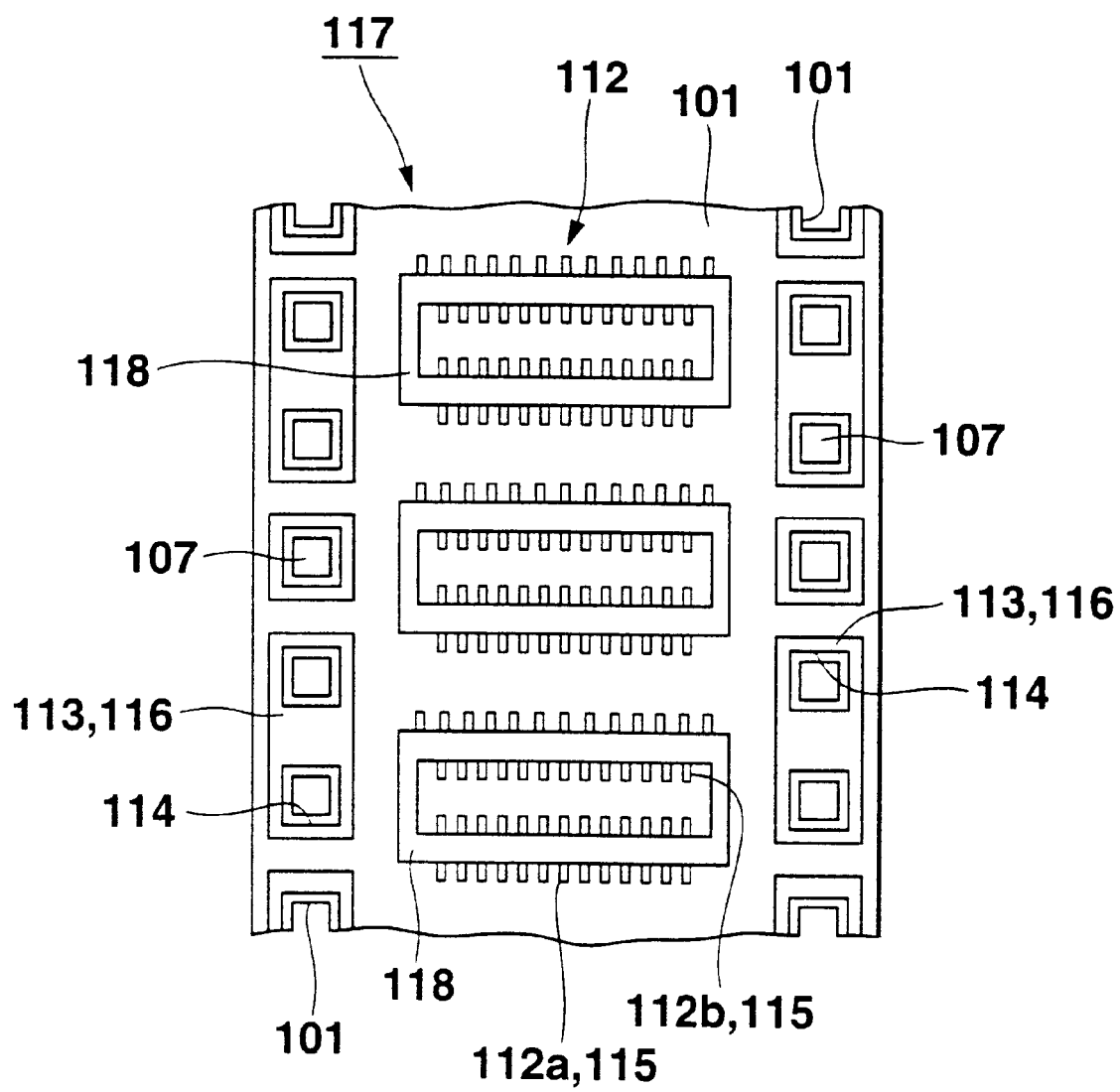
FIG. 24 is a plan view useful in explaining part of a carrier tape as an eighth example.
Figure 25:
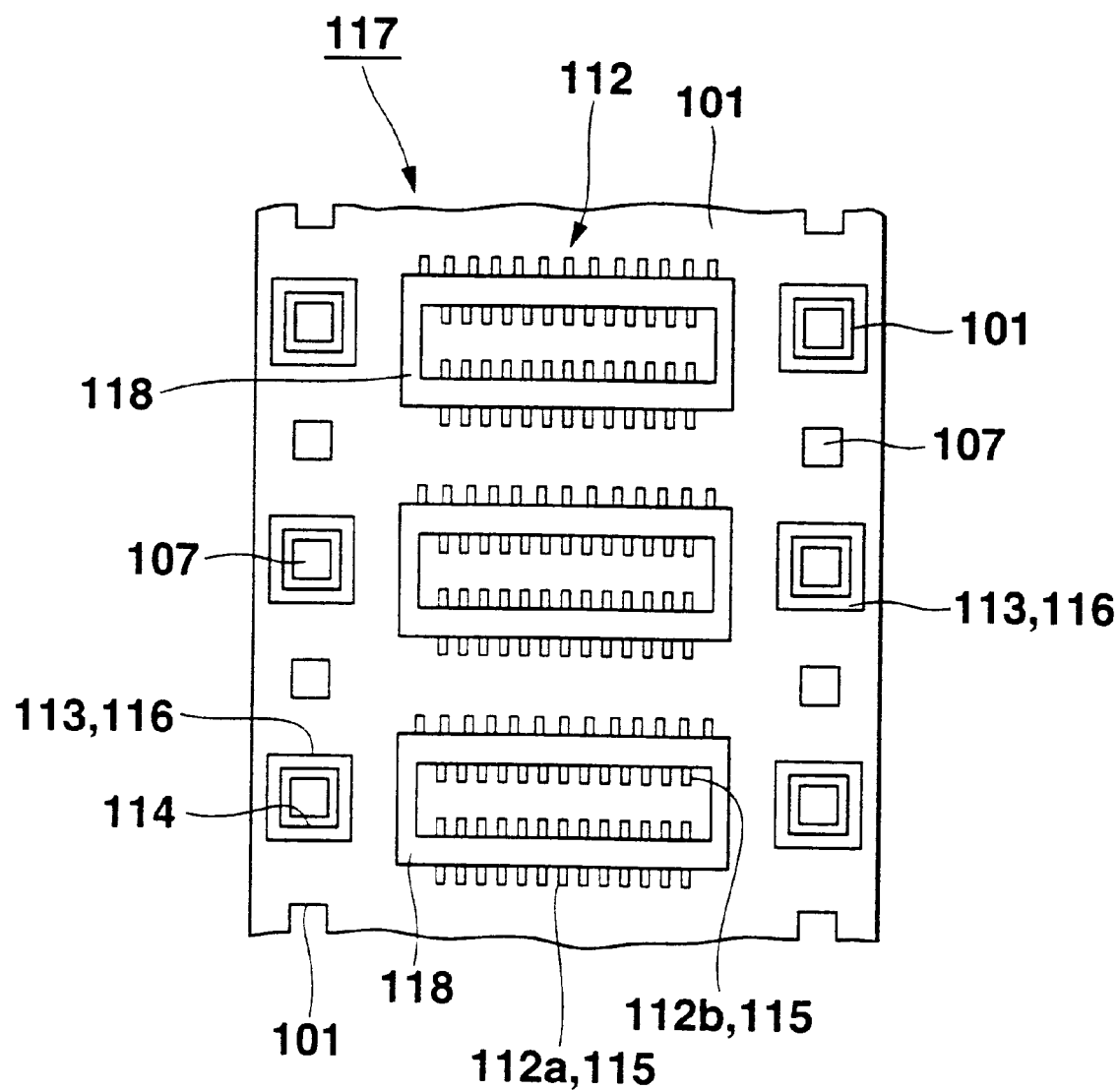
FIG. 25 is a plan view useful in explaining part of a carrier tape as a ninth example.

Moreover, although the first and second reinforcing layers 113 and 116 are continuously formed along the length of the base film 101 as shown in FIG. 11, they may be separated in units of one sprocket hole 107 as shown in FIG. 22, or in units of two adjacent sprocket holes 107 as shown in FIG. 23, or separated as shown in FIG. 24, which is a combination of FIGS. 22 and 23. Furthermore, as shown in FIG. 25, the first and second reinforcing layers 113 and 116 may be formed around some of sprocket holes 107, and not formed around other sprocket holes 107. The openings 114 formed in the first and second reinforcing layers 113 and 116 as shown in FIGS. 22 to 25 may have shapes as shown in FIGS. 17 to 20. Also, the first and second reinforcing layers 113 and 116 shown in FIGS. 22 to 25 may have edges as shown in FIG. 21. In addition, the openings 114 formed in the first and second reinforcing layers 113 and 116 as shown in FIGS. 22 to 25 may have shapes as shown in FIGS. 17 to 20, and these first and second reinforcing layers 113 and 116 may have edges as shown in FIG. 21.

Although in the above embodiments, the sprocket holes 107 are square, they may have another shape such as a circular shape. Further, the openings 114 formed in the first and second reinforcing layers 113 and 116 may not necessarily be similar in shape to the sprocket holes 107.

Figure 26:
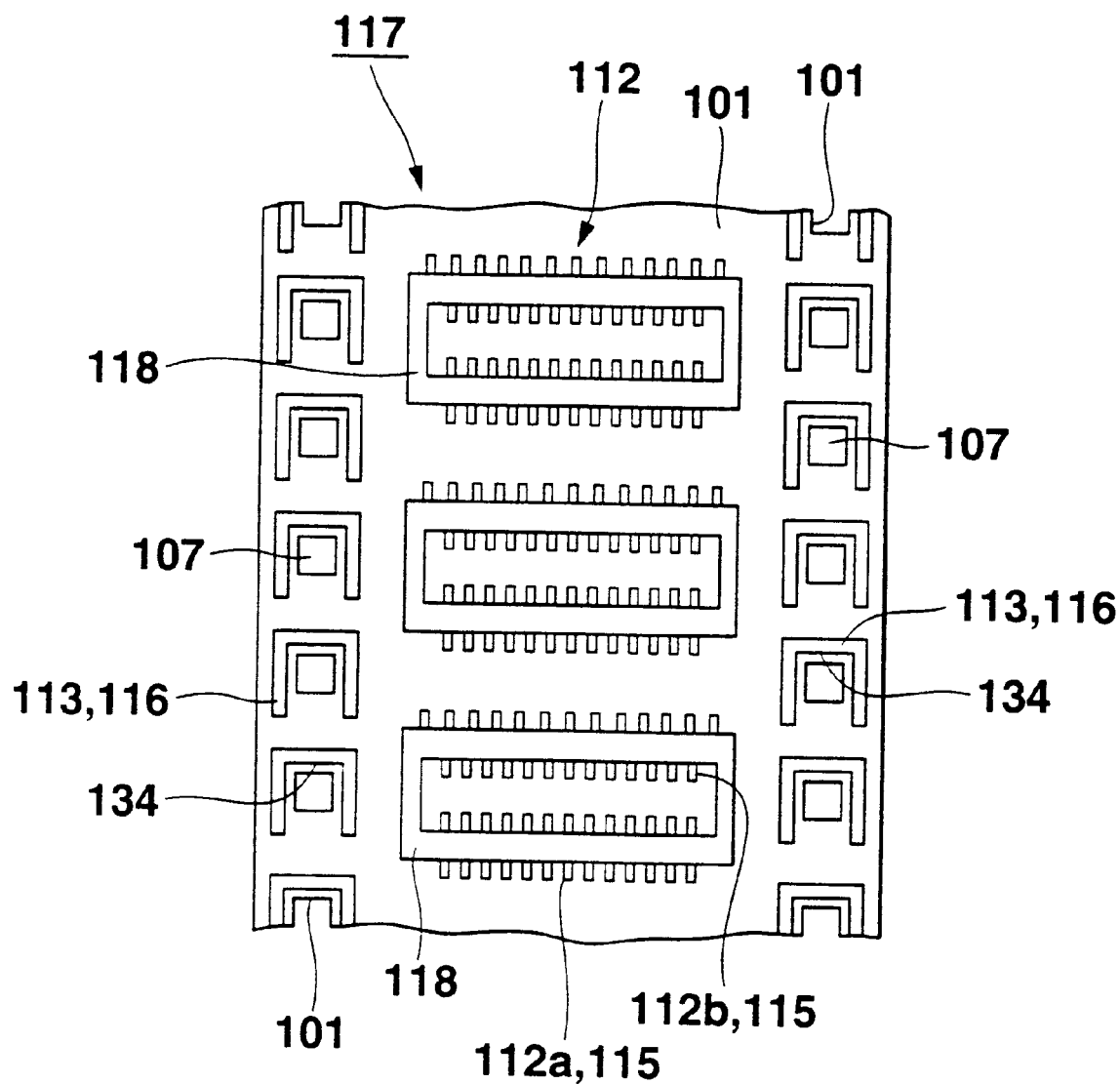
FIG. 26 is a plan view useful in explaining part of a carrier tape as a tenth example.

Furthermore, as shown in FIG. 26, the first and second reinforcing layers 113 and 116 may be formed such that their walls 134 surround only three sides of each square sprocket hole 107 or only one side thereof. Further, the structure of FIG. 26 may be modified such that the first and second reinforcing layers 113 and 116 are provided around some sprocket holes 107 and not around other sprocket holes 107 as shown in FIG. 25.

In the above embodiments, the first and second reinforcing layers 113 and 116 are formed by patterning using the same materials and executed in the same process as the wiring 112 and the tin plate layers 115. However, they may be formed using different materials from those of the wiring 112 and the tin plate layers 115. It suffices if the materials may be an alloy with an appropriate rigidity, an inorganic compound other than metals, or an organic compound. The first and second reinforcing layers 113 and 116 may be formed by patterning in a different process from that of the wiring 112 and the tin plate layers 115. The periphery of each sprocket hole 107 may be reinforced by a one-layer reinforcing member or a three-layer reinforcing member. In the case of using a two-layer reinforcing member, they may have different shapes.

FIGS. 27 to 34 are views useful in explaining the steps of manufacturing a COF type carrier tape according to yet another embodiment of the invention. Referring to these figures in order, the structure of the carrier tape of this embodiment and its manufacturing method will be described.

Figure 27:
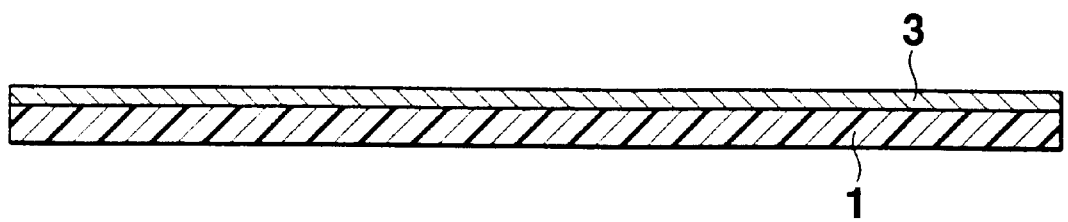
FIG. 27 is a sectional view useful in explaining a process of the manufacture of a carrier tape according to another embodiment of the invention.

First, as is shown in FIG. 27, a conductive film 3 made of copper and having a thickness of about 8 $\mu$m is formed on the upper surface of a base film 1 made of polyimide and having a thickness of about 25 $\mu$m or 38 $\mu$m. Further, the base film 1 and the conductive film 3 are long films having a width of about 35 mm or about 48 mm.

Figure 28:
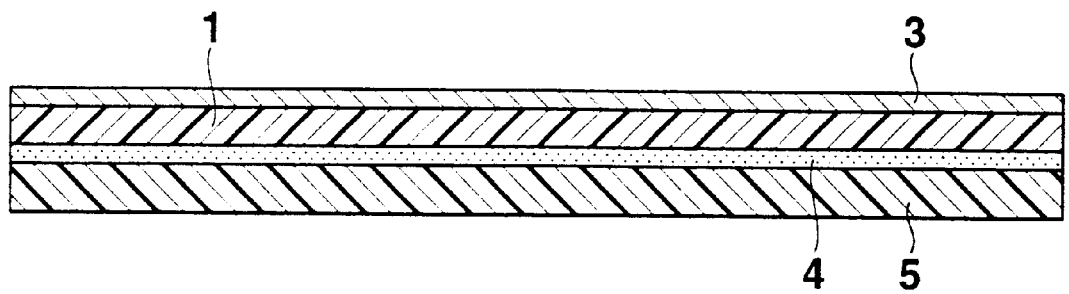
FIG. 28 is a sectional view useful in explaining a process of the manufacture of the carrier tape after the process of FIG. 27.

Subsequently, as is shown in FIG. 28, a reinforcing film 5 made of PET (polyethylene terephthalate) and having a thickness of about 50 $\mu$m is adhered to the lower surface of the base film 1 with an adhesive 4 interposed therebetween. The reinforcing film 5 also has a width of 35 mm and a long length. The reinforcing film 5 is provided for securing the transfer of the base film during manufacturing, and may have a thickness of 50 $\mu$m or more. For example, it may have a thickness of about 100 $\mu$m or about 125 $\mu$m. The thicker the reinforcing film 5, the more reliable the transfer of the base film during the manufacture of a carrier tape.

Figure 29:
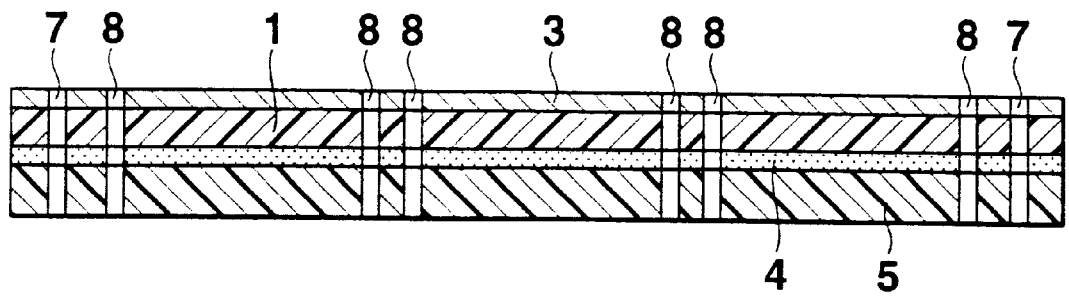
FIG. 29 is a sectional view useful in explaining a process of the manufacture of the carrier tape after the process of FIG. 28.

Referring then to FIG. 29, two rows of first sprocket holes 7 and six rows of second sprocket holes 8 inside the first sprocket holes 7 are formed for forming three carrier tapes, by punching using a usual die, in width-directional opposite end portions of the base film 1, the conductive film 3, the adhesive 4 and the reinforcing film 5. Each row of the sprocket holes 7 and 8 are also formed along the length of the base film 1 at regular intervals. The first sprocket holes 7 have a circular cross section, while the second sprocket holes 8 have a square cross section with one side of 1.42 mm.

Figure 30:
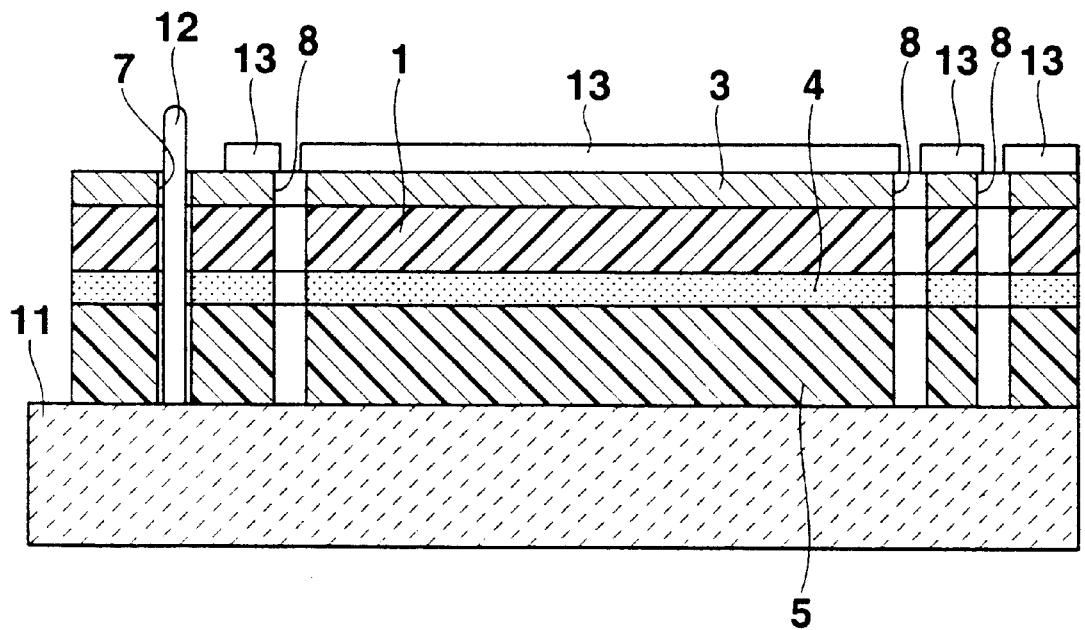
FIG. 30 is a sectional view useful in explaining a process of the manufacture of the carrier tape after the process of FIG. 29.

FIG. 30 is an enlarged view showing a left side portion of a structure of FIG. 29 obtained after the process of FIG. 29. As shown, a plurality of pins 12 are provided on a pin roller 11 at intervals corresponding to the intervals of the sprocket holes 7, which are provided in the width direction and length direction of the base film 1. When width-directional pins 12 are received in corresponding width-directional ones of the sprocket holes 7 of the base film 1, the base film 1 is engaged with the pin roller 11. In this state, the pin roller 11 is rotated at a predetermined speed in a predetermined direction, thereby sequentially engaging length-directional pins 12 with length-directional sprocket holes 7. Thus, the base film 1 is transferred at the predetermined speed in a predetermined direction, together with the films 3–5. At this time, the reinforcing film 5 is situated on the pin roller 11 side. During the transfer, a resist 13 is coated on the conductive film 3 between the width-directional sprocket holes 7. Since in this state, the resist 13 has only a thickness of about several μm, it does not bridge each sprocket hole 8 having one side of 1.42 mm. The resist 13 also has a width of 35 mm and a long length.

Although the base film 1 has a relatively thin thickness of about 25 to 38 μm, its lower surface is supported by the reinforcing film 5 with a thickness of about 50 μm or more, the entire thickness is sufficient to prevent width-directional bending of the base film 1. As a result, the transfer by the pin roller 11 can be executed smoothly, with the pins 12 of the pin roller 11 separated from the resist 13 and without deforming the sprocket holes 8.

Figure 31:
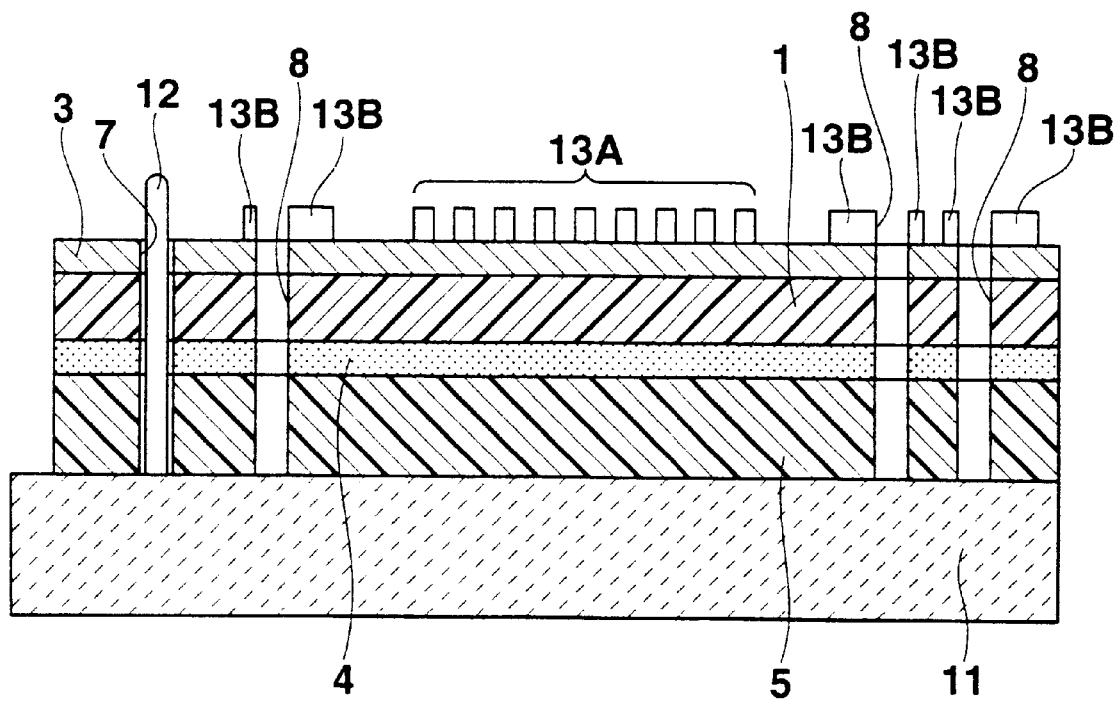
FIG. 31 is a sectional view useful in explaining a process of the manufacture of the carrier tape after the process of FIG. 30.

After that, as shown in FIG. 31, a predetermined resist pattern 13A is formed, by predetermined exposure and development treatments, on the conductive film 3 in a wiring-to-be-formed area that is a width-directional middle area of the upper surface of the base film 1. At the same time, band-shaped resist patterns 13B are formed on those portions of the conductive film 3, which are situated around the second sprocket holes 8, such that they extend along the length of the base film 1.

Figure 32:
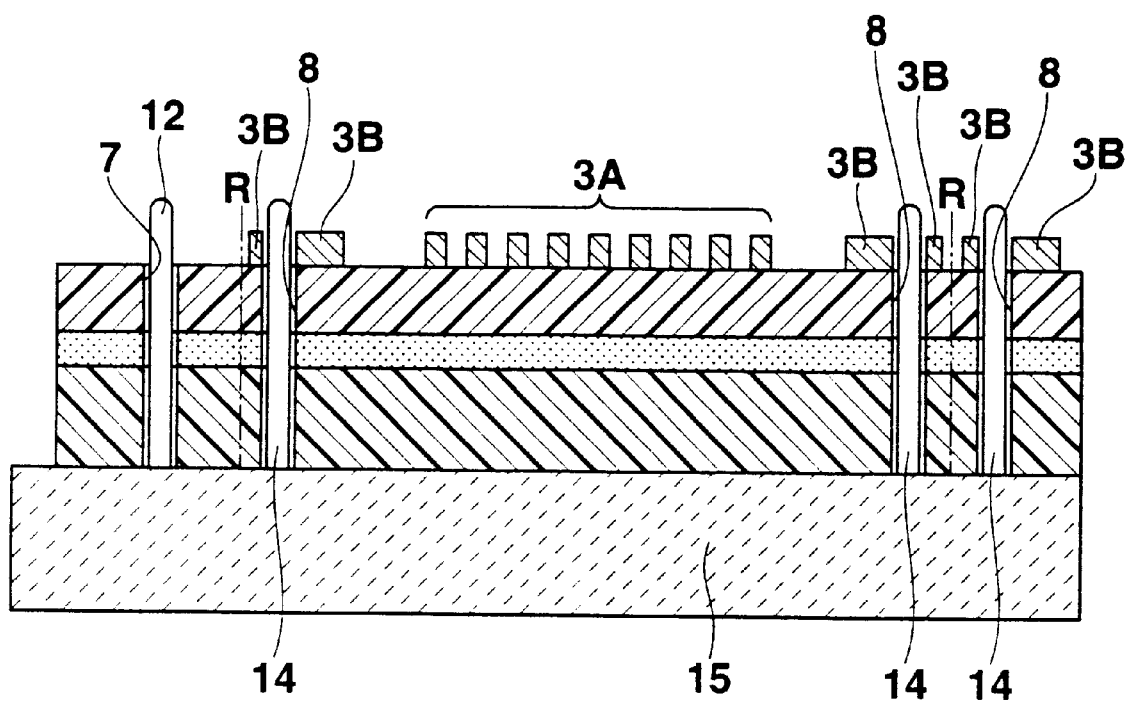
FIG. 32 is a sectional view useful in explaining a process of the manufacture of the carrier tape after the process of FIG. 31.

Subsequently, as shown in FIG. 32, the conductive film 3 is etched using the resist patterns 13A and 13B as masks, thereby forming predetermined wiring 3A in the wiring-to-be-formed area that is the width-directional middle area of the upper surface of the base film 1, and also forming band-shaped reinforcing films 3B extending along the length of the base film 1, on those portions of the base film 1 which are situated around the sprocket holes 8. After that, the resist patterns 13A and 13B are removed, and non-eletrolytic plating of tin is executed to form tin films 17 on the wiring 3A and the reinforcing films 3B. Protective films 19 are formed by solder printing or screen printing on the wiring 3A except for its opposite end portions.

In the next step, two pins 12 provided on a pin roller 15 width-directionally parallel to each other are inserted into corresponding sprocket holes 7 of the base film 1. Similarly, six pins 14 arranged on the pin roller 15 width-directionally parallel to each other are inserted into corresponding sprocket holes 8 of the base film 1. Sets of such eight width-directional pins 12 and 14 are arranged in the direction of rotation of the pin roller 15 with the same pitch as the sprocket holes 8 formed in the base film 1 along its length.

Figure 33:
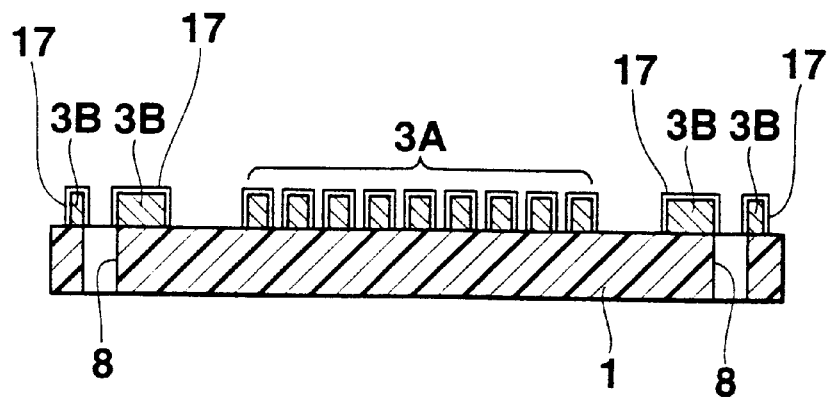
FIG. 33 is a sectional view illustrating a carrier tape according to yet another embodiment of the invention.
Figure 34:
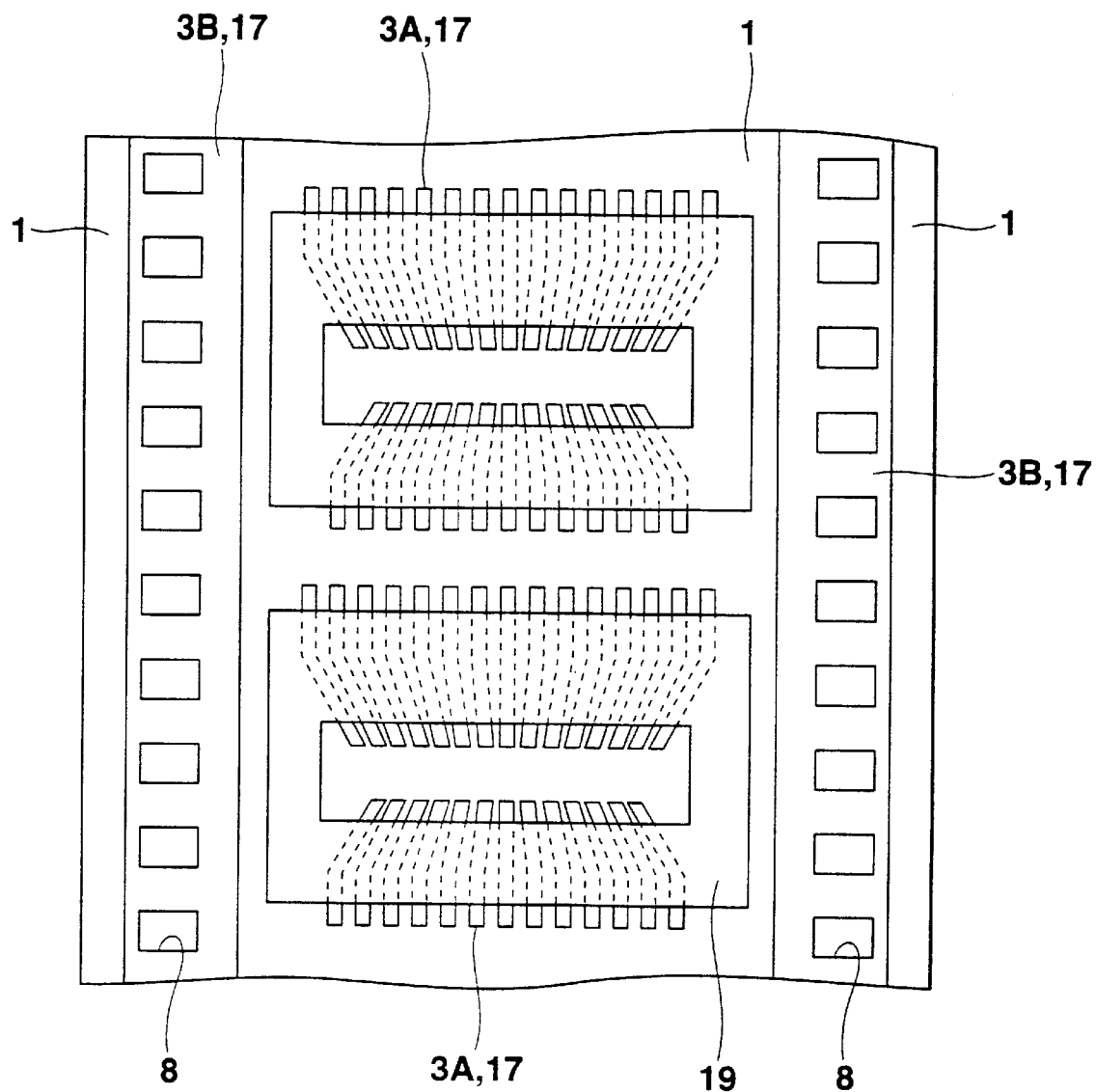
FIG. 34 is a plan view showing part of the carrier tape of FIG. 33.
Figure 35:
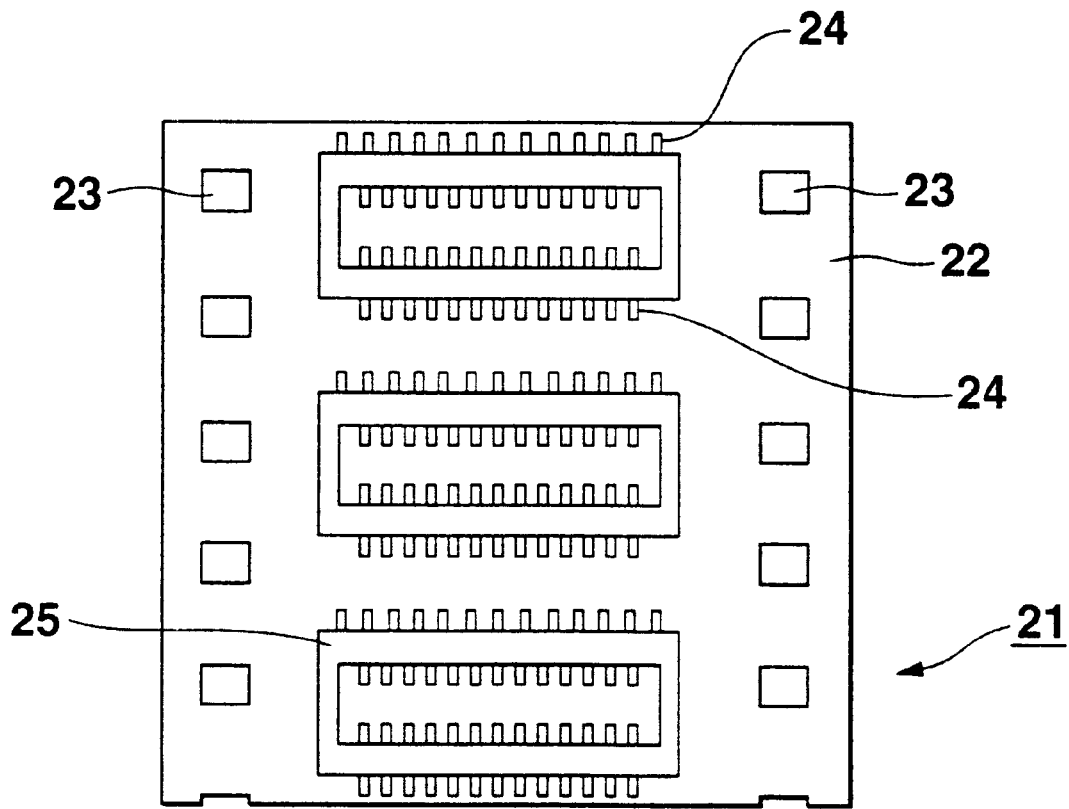
FIG. 35 is a plan view illustrating part of a conventional COF type carrier tape.

The base film 1, the adhesive 4 and the reinforcing film 5 are cut along the one-dot-chain lines R by a cutter (not shown) between the pin roller 15 and another pin roller of the same structure, thereby separating the adhesive 4 and the reinforcing film 5 from the base film 1. As a result, a carrier tape as shown in FIG. 33 is obtained. FIG. 34 is a plan view of the carrier tape of FIG. 33. In the thus-obtained carrier tape, the band-shaped reinforcing films 3B are formed on width-directionally opposite end portions of the base film 1. In other words, the reinforcing films 3B are formed on those portions of the base film 1 which are situated around the sprocket holes 8. Accordingly, the portions around the sprocket holes 8 can be made to have a desired strength even if the base film 1 has a relatively thin thickness of about 25 to 38 μm. As a result, even after the process shown in FIG. 34, the transfer by the pin roller can be executed smoothly without deforming the sprocket holes 8, which means that the alignment accuracy in a later process is prevented from being adversely affected by such deformed holes. In addition, since the portions of the base film 1, the adhesive 4 and the reinforcing film 5, which are indicated by the one-dot-chain lines R, include no reinforcing films 3B, metal particles will not occur when the portions are cut. This leads to prevention of shortcircuiting of the wiring 3A due to attachment of metal particles thereto.

Since in the above case, the adhesive 4 is removed from the lower surface of the base film 1, the lower surface is free from stickiness and hence free from dust, thereby enhancing workability of the base film 1.

Although in the above embodiment, the base film 1 has a thickness of 48 mm, it may have a width of 70 mm or more, or a width of 35 mm or less.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A carrier tape for connecting a first circuit to a second circuit, comprising:
   an elongated base film having a plurality of holes;
   a wire formed on one surface of the elongated base film;
   a reinforcing layer formed on said one surface of the elongated base film, and having at least one opening corresponding to one of the plurality of holes of the elongated base film; and
   a reinforcing film attached to a second surface of the elongated base film.

2. The carrier tape according to claim 1, wherein the at least one opening of the reinforcing layer exposes at least a part of a portion of the elongated base film surrounding one of the plurality of holes of the elongated base film.

3. The carrier tape according to claim 2, wherein said part of the portion of the elongated base film extends in parallel with respect to a lateral direction of the elongated base film.

4. The carrier tape according to claim 2, wherein said a part of the portion of the elongated base film extends in parallel with respect to a longitudinal direction of the elongated base film.

5. The carrier tape according to claim 1, wherein said reinforcing layer exposes the one surface at one of two lateral side-ends of the elongated base film.

6. The carrier rape according to claim 1, wherein the detachable reinforcing film attached to the other surface of the base film with an adhesive layer.

7. The carrier tape according to claim 6, wherein the reinforcing film is detachable from the elongated base film.

8. The carrier tape according to claim 1, wherein the reinforcing layer is formed of the same material as the wire.

9. The carrier tape according to claim 1, wherein the reinforcing layer continuously extends in a longitudinal direction of the elongated base film.

10. The carrier tape according to claim 1, wherein the plurality of holes of the elongated base film are sprocket holes.

11. A carrier tape for connecting a first circuit to a second circuit, comprising:
an elongated base film having a plurality of holes;
a wire formed on one surface of the elongated base film; and
a reinforcing layer formed on a second surface of the elongated base film, and having at least one opening corresponding to one of the plurality of holes of the elongated base film, said at least one opening exposing at least a part of a portion of the elongated base film surrounding one of the plurality of holes of the elongated base film.

12. The carrier tape according to claim 11, further comprising a detachable reinforcing film attached to the second surface of the elongated base film.

13. The carrier tape according to claim 11, wherein the reinforcing layer exposes the one surface at one of two lateral side-ends of the elongated base film.

14. The carrier tape according to claim 11, wherein the plurality of holes of the elongated base film are sprocket holes.

15. A carrier tape for a circuit connection, comprising:
an elongated base film having a plurality of sprocket holes arranged along a longitudinal direction of the elongated base film;
a wire formed on one surface of the elongated base film; and
a reinforcing layer formed on said one surface of the elongated base film and arranged between the plurality of sprocket holes, the reinforcing layer exposing at least a part of a portion of the elongated base film surrounding the plurality of sprocket holes of the elongated base film.

16. The carrier tape according to claim 15, further comprising a detachable reinforcing film attached to a second surface of the elongated base film.

17. The carrier tape according to claim 15, wherein said part of the portion of the elongated base film contacts a pin when the pin carries the carrier tape.

18. The carrier tape according to claim 15, wherein the reinforcing layer exposes said one surface at one of two lateral side-ends of the elongated base film.

19. A carrier tape for connecting a circuit to another member, comprising;
an elongated base film having a plurality of holes;
a wire formed on one surface of the elongated base film; and
a reinforcing layer formed on said one surface of the elongated base film and arranged between the plurality of holes, the reinforcing layer exposing said one surface at one of two lateral side-ends of the elongated base film.

20. The carrier tape according to claim 19, wherein the reinforcing layer is formed of the same material as the wire.

21. The carrier tape according to claim 19, further comprising a detachable reinforcing film attached to a second surface of the elongated base film.

22. The carrier tape according to claim 19, wherein the plurality of holes of the elongated base film are sprocket holes.

23. A method of manufacturing a carrier tape for a circuit connection, comprising:
forming a wire on a width-directionally central portion of one surface of an elongated base film supported by a detachable reinforcing film, the elongated base film having a plurality of holes formed in width-directional opposite portions thereof; and
forming a reinforcing layer on said one surface of the elongated base film.

24. The method according to claim 23, further comprising detaching the detachable reinforcing film from the elongated base film after the wire is formed.

25. The method according to claim 23, wherein the wire forming and the reinforcing layer forming are simultaneously conducted by patterning a conductive layer provided on said one surface of the base film.

26. The method according to claim 23, wherein the reinforcing layer exposes at least a part of a portion of the elongated base film surrounding at least one of the plurality of holes of the elongated base film.

27. The method according to claim 26, wherein said part of the portion of the elongated base film contacts a pin when the pin carries the carrier tape.

28. The method according to claim 23, wherein the reinforcing layer exposes said one surface at one of two lateral side-ends of the elongated base film.

29. A method of manufacturing a carrier tape for connecting an integrated circuit to an external circuit, comprising the steps of:
forming a wire on a width-directionally central portion of one surface of an elongated base film having a plurality of holes; and
forming a reinforcing layer on said one surface of the elongated base film between the plurality of holes, the reinforcing layer exposing said one surface at one lateral side-end of the elongated base film.

30. The method according to claim 19, wherein the elongated base film is supported by a detachable reinforcing film during the wire forming step.

31. The method according to claim 29, wherein the elongated base film is supported by a detachable reinforcing film during the reinforcing layer forming step.

32. The method according to claim 29, wherein the wire forming step and the reinforcing layer forming step are a common step of simultaneously forming the wire and the reinforcing layer by patterning a conductive layer provided on said one surface of the base film.

33. The method according to claim 29, wherein the reinforcing layer exposes at least a part of a portion of the elongated base film surrounding one of the plurality of holes of the elongated base film.

34. The method according to claim 33, wherein said a part of the portion of the elongated base film contacts a pin when the pin carries the carrier tape.

* * * * *